(12) United States Patent
Park et al.

(10) Patent No.: US 8,673,694 B2
(45) Date of Patent: Mar. 18, 2014

(54) THIN FILM TRANSISTOR ARRAY PANEL AND METHOD OF MANUFACTURING THE SAME

(75) Inventors: Sun Park, Suwon-si (KR); Chun-Gi You, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 1542 days.

(21) Appl. No.: 11/756,217

(22) Filed: May 31, 2007

(65) Prior Publication Data

US 2008/0048260 A1  Feb. 28, 2008

(30) Foreign Application Priority Data

Aug. 28, 2006  (KR) .......................... 10-2006-0081683

(51) Int. Cl.
  *H01L 29/786* (2006.01)
(52) U.S. Cl.
  USPC ...... 438/149; 257/72; 257/347; 257/E27.111; 257/E29.151; 257/E21.593; 257/E21.415; 257/E29.147; 438/158
(58) Field of Classification Search
  USPC .............. 257/E27.111, E29.147, 72, 347, 257/E29.151, E21.593, E21.415; 438/149, 438/685
  See application file for complete search history.

(56) References Cited

U.S. PATENT DOCUMENTS

| | | | | |
|---|---|---|---|---|
| 5,903,326 A * | 5/1999 | Lee | .................................. | 349/42 |
| 6,870,589 B2 | 3/2005 | Tatsumi | | |
| 2001/0019125 A1 * | 9/2001 | Hong et al. | ..................... | 257/59 |
| 2002/0109811 A1 * | 8/2002 | Park et al. | ..................... | 349/113 |
| 2003/0073267 A1 | 4/2003 | Baek et al. | | |
| 2004/0257509 A1 * | 12/2004 | Lee et al. | ..................... | 349/139 |

FOREIGN PATENT DOCUMENTS

| | | |
|---|---|---|
| CN | 1519955 A | 8/2004 |
| CN | 1808709 A | 7/2006 |
| JP | 2000-035592 | 2/2000 |
| JP | 2000-221540 | 8/2000 |
| JP | 2001-229805 | 8/2001 |
| JP | 2001230321 A | 8/2001 |
| JP | 2002006773 | 1/2002 |
| JP | 2002236459 | 8/2002 |
| JP | 2003-131253 | 5/2003 |
| JP | 2004096115 | 3/2004 |
| JP | 2004282079 | 10/2004 |
| JP | 2005-010775 A | 1/2005 |
| JP | 2006208881 | 8/2006 |
| KR | 1020020062273 A | 7/2002 |
| KR | 1020020064011 | 8/2002 |
| KR | 1020040059066 | 7/2004 |
| KR | 1020050024175 | 3/2005 |
| KR | 10-0538328 | 12/2005 |
| KR | 1020060038788 | 5/2006 |
| KR | 1020060053923 | 5/2006 |

* cited by examiner

*Primary Examiner* — Ermias Woldegeorgis
(74) *Attorney, Agent, or Firm* — Cantor Colburn LLP

(57) ABSTRACT

A thin film transistor array panel includes a passivation layer formed on a plurality of end portions of a plurality of gate lines. A portion of the passivation layer has a porous structure formed between a connection portion of a flexible printed circuit substrate and a thin film transistor substrate such that when the flexible printed circuit substrate and the thin film transistor array panel are connected to each other, the passivation layer having a porous structure and which is formed at the connection portion therebetween connects the flexible printed circuit substrate with the thin film transistor array panel thereby minimizing an exposed area of the metal of the connection portion to improve a corrosion resistance thereof.

9 Claims, 32 Drawing Sheets

THIN FILM TRANSISTOR ARRAY PANEL AND METHOD OF MANUFACTURING THE SAME

This application claims priority to Korean Patent Application No. 10-2006-0081683, filed on Aug. 28, 2006, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel and a method of manufacturing the thin film transistor array panel, and in particular, a thin film transistor array panel and method of manufacturing the same having improved corrosion resistance which provides a benefit of enhanced reliability of the thin film transistor array panel.

(b) Description of the Related Art

A liquid crystal display ("LCD") is one type of flat panel display which is widely used. The liquid crystal display includes field generating electrodes which generate an electric field, and a liquid crystal layer interposed therebetween. In the liquid crystal display, a voltage is applied to the field generating electrodes to generate an electric field in the liquid crystal layer. The electric field determines the alignment of liquid crystal molecules in the liquid crystal layer and a polarization of incident light is thereby controlled to display an image. Typically, a thin film transistor ("TFT") controls signals transmitted to the field generating electrodes.

The thin film transistor is used as a switching element which either transmits or does not transmit image signals through data lines to pixel electrodes according to scanning signals transmitted through gate lines.

A corrosion-free connection between a flexible printed circuit substrate and an integrated circuit ("IC") and a pad of a circuit portion of a thin film transistor substrate is desired to apply an appropriate voltage to the thin film transistor and to ensure reliable communications between the thin film transistor and the IC. Currently, however, when the flexible printed circuit substrate and the IC are connected to the pad of the circuit portion of the thin film transistor substrate, there is a problem in which a metal of connection portions of the pad of the circuit portion of the thin film transistor substrate corrodes.

BRIEF SUMMARY OF THE INVENTION

The present invention has been made in an effort to provide a thin film transistor array panel and a method of manufacturing the thin film transistor array panel having an advantage of minimizing an exposed area of a metal of a connection portion between a flexible printed circuit substrate and a thin film transistor substrate and thereby improving a corrosion resistance to enhance a reliability of the thin film transistor array panel. An exemplary embodiment of the present invention provides a thin film transistor array panel in which a passivation layer of a connection portion between a flexible printed circuit substrate and a thin film transistor substrate is formed to have a porous structure.

More specifically, a thin film transistor array panel according to an exemplary embodiment of the resent invention includes a substrate, gate lines having end portions formed on the substrate, a gate insulating layer formed on the gate lines, a passivation layer formed on the gate lines and which has a plurality of first contact holes which expose the end portions of the gate lines and contact assistants connected to the end portions of the gate lines through the plurality of first contact holes, wherein each of the end portions of the gate lines is connected to one of the contact assistants through at least two of the first contact holes.

The passivation layer may include an inorganic layer and an organic layer as multi layers.

The passivation layer may include a single inorganic layer.

Diameter of the first hole may range 3~6 μm and distance two neighboring first contact holes may range 6~8 μm.

The gate insulating layer may have a plurality of second contact holes, and the at least two of the first contact holes exposing a single end portion of the gate lines may be located within a single second contact hole.

According to another exemplary embodiment of the present invention, a method of manufacturing a thin film transistor array panel includes forming gate lines having end portions on a substrate, forming a gate insulating layer on the gate lines, forming a plurality of first contact holes exposing the end portions of the gate lines by etching a part of the gate insulating layer on the end portions of the gate lines, forming a semiconductor layer on the gate insulating layer, forming data lines and drain electrodes on the semiconductor layer, forming a passivation layer on the data lines and the drain electrodes, forming a plurality of second contact holes exposing the end portions of the gate lines by etching a part of the passivation layer on the end portions of the gate lines, forming pixel electrodes connected to the drain electrodes and forming contact assistants connected to the end portions of the gate lines through the plurality of second contact holes.

Each of the end portions of the gate lines may be connected to one of the contact assistants through at least two of the second contact holes.

The passivation layer may include an inorganic layer and an organic layer as multi layers.

The passivation layer may include a single inorganic layer.

Diameter of the first hole may range 3~6 μm and distance two neighboring first contact holes may range 6~8 μm.

The at least two of the second contact holes exposing a single end portion of the gate lines may be formed within a single first contact hole.

Another exemplary embodiment of the present invention provides a thin film transistor array panel in which a corrosion protecting layer is formed at a connection portion between a flexible printed circuit and a thin film transistor substrate, and having a passivation layer with a porous structure.

More specifically, a thin film transistor array panel according to another exemplary embodiment of the present invention includes a substrate, gate lines having end portions formed on the substrate, a gate insulating layer formed on the gate lines and having a plurality of first contact holes exposing the end portions of the gate lines, corrosion protecting layers formed on the gate insulating layer and connected to the end portions of the gate lines through the plurality of first contact holes, a passivation layer formed on the corrosion protecting layers and having a plurality of second contact holes exposing the corrosion protecting layers and contact assistants connected to the corrosion protecting layers through the plurality of the second contact holes.

Each of the corrosion protecting layers may be connected to one of the contact assistants through at least two of the second contact holes.

The passivation layer may include an inorganic layer and an organic layer as multi layers.

The passivation layer may include a single inorganic layer.

Diameter of the first hole may range 3~6 μm and distance two neighboring first contact holes may range 6~8 μm.

The corrosion protecting layers may be made at least one of a molybdenum-based metal, a copper-based metal, a titanium-based metal, a chromium-based metal.

According to another exemplary embodiment of the present invention, a method of manufacturing a thin film transistor array panel includes forming gate lines having end portions on a substrate, forming a gate insulating layer on the gate lines, forming a plurality of first contact holes exposing the end portions of the gate lines by etching a part of the gate insulating layer on the end portions of the gate lines, forming a semiconductor layer on the gate insulating layer, forming data lines, drain electrodes and corrosion protecting layers connected to the end portions of the gate lines through the plurality of first contact holes on the semiconductor layer, forming a passivation layer on the data lines and the drain electrodes, forming a plurality of second contact holes exposing the corrosion protection layers by etching a part of the passivation layer on the corrosion protection layers, forming pixel electrodes connected to the drain electrodes and forming contact assistants connected to the corrosion protecting layers through the plurality of second contact holes.

Each of the corrosion protecting layers may be connected to one of the contact assistants through at least two of the second contact holes.

The passivation layer may include an inorganic layer and an organic layer as mutil layers.

Diameter of the first hole may range 3~6 μm and distance two neighboring first contact holes may range 6~8 μm.

The corrosion protecting layers may be made at least one of a molybdenum-based metal, a copper-based metal, a titanium-based metal, a chromium-based metal.

BRIEF DESCRIPTION OF THE DRAWINGS

The above and other aspects, features and advantages of the present invention will become more apparent by describing in further detail exemplary embodiments thereof with respect to the accompanying drawings, in which.

DETAILED DESCRIPTION OF THE INVENTION

Figure 1:
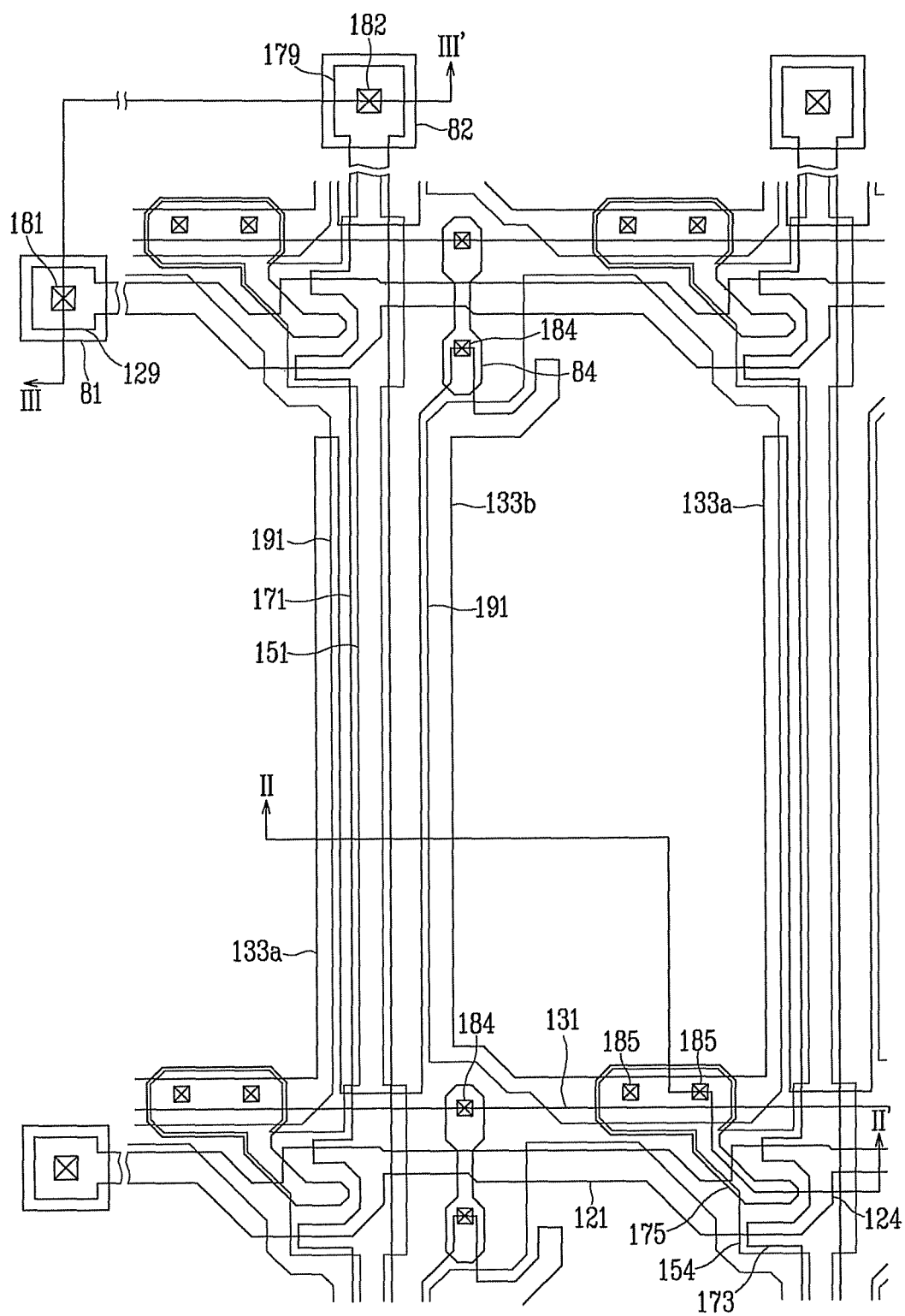
FIG. 1 is a plan view of a thin film transistor array panel according to an exemplary embodiment of the present invention.

The invention now will be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, a thin film transistor array panel according to an exemplary embodiment of the present invention will be described in further detail with reference to FIGS. 1 to 3.

Figure 2:
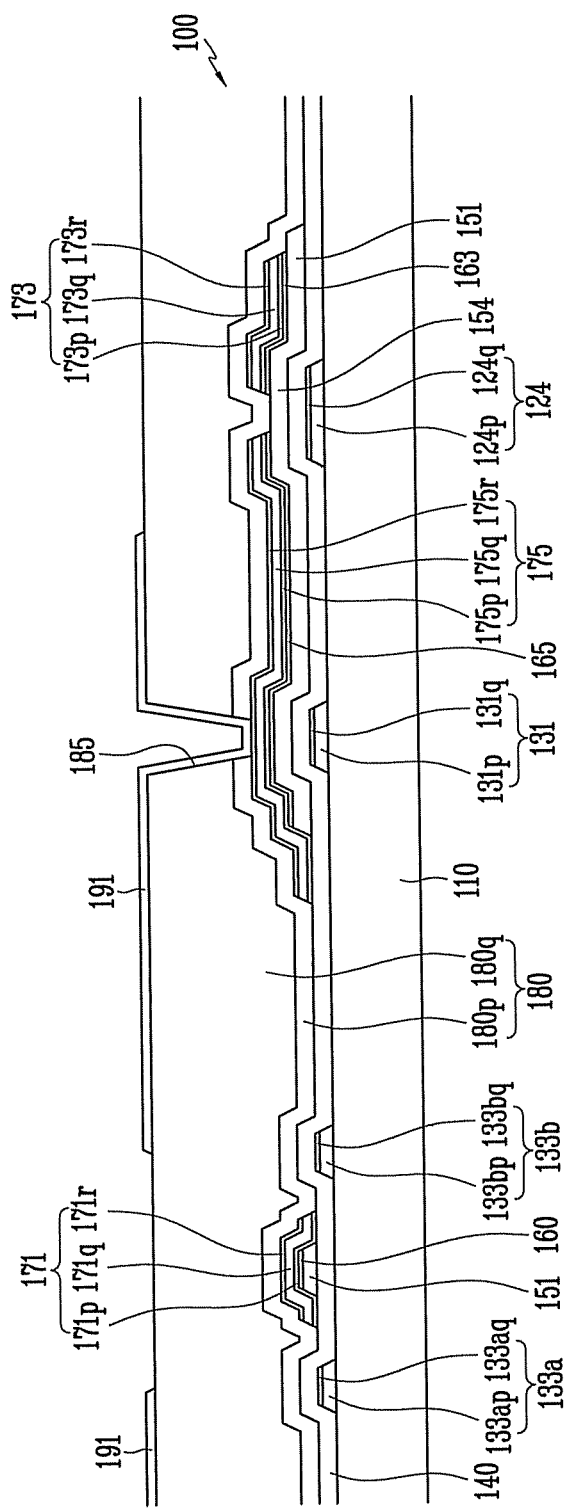
FIGS. 2 and 3 are partial cross-sectional views taken along lines II-II' and III-III', respectively, illustrating an exemplary embodiment of a manufacturing process of the thin film transistor array panel in FIG. 1.
Figure 3:
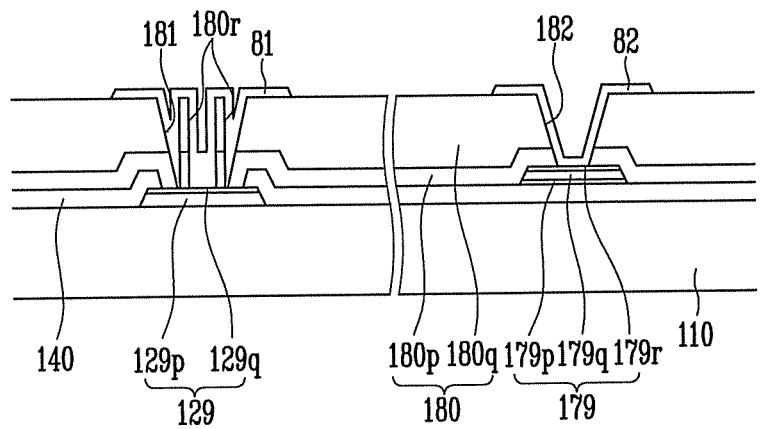

FIG. 1 is a layout view of a thin film transistor ("TFT") array panel according to an exemplary embodiment of the present invention, and FIGS. 2 and 3 are partial cross-sectional views taken along lines II-II' and III-III', respectively, illustrating an exemplary embodiment of a manufacturing process of the TFT array panel in FIG. 1.

A TFT array panel 100 includes a plurality of gate lines 121 and a plurality of storage electrode lines 131 which are formed on an insulation substrate 110 made of transparent glass or plastic, for example, but is not limited thereto.

The gate lines 121 transmit gate signals, and generally extend in a substantially horizontal direction as illustrated in FIG. 1. Each of the gate lines 121 includes a plurality of gate electrodes 124 which protrude downward and a gate line end portion 129 which is larger than the other portions of the gate line 121 to facilitate connections to another layer or an outside driving circuit. A gate driving circuit (not shown) for generating the gate signals may be mounted on a flexible printed circuit film (not shown) attached to the substrate 110, may be directly mounted on the substrate 110, or may be integrated into the substrate 110, for example, but is not limited thereto. When the gate driving circuit is integrated into the substrate 110, the gate lines 121 may extend so as to be directly connected to the gate driving circuit.

A predetermined voltage is applied to each of the storage electrode lines 131. Each of the storage electrode lines 131 includes a main storage electrode line (not specifically labeled in FIG. 1) extending substantially parallel to the gate lines 121 and a plurality of pairs of storage electrodes 133a and 133b which branch up from the storage electrode line 131, as illustrated in FIG. 1. Each of the storage electrode lines 131 is provided between two gate lines 121 which are adjacent to each other, and the main storage electrode line is closer to the lower one of the two adjacent gate lines 121, as illustrated in FIG. 1. Each of the storage electrodes 133a and 133b includes a fixed end connected to the main storage electrode line and a free end opposite to the fixed end. The fixed end of the storage electrode 133b has a large area relative to other portions of the storage electrode 133b, and the free end thereof branches into two parts. More specifically, the free end of the storage electrode 133b branches into a linear part and a non-linear part, e.g., a curved part, which curves around a pixel electrode 191 as illustrated in FIG. 1. The shape and location of the storage electrode line 131 and the storage electrodes 133a and 133b may be modified in various ways in alternative exemplary embodiments of the present invention.

In FIG. 2, the lower layers of the gate electrodes 124, the storage electrode line 131 and the storage electrodes 131a and 131b are identified by the letter "p," and the upper layers thereof are identified by the letter "q." Referring to FIG. 2, the gate electrodes 124 include a lower layer 124p and an upper layer 124q. The storage electrode line 131 and the storage electrodes 131a and 131b include lower layers 131p, 133ap and 133bp, respectively, and upper layers 131q, 133aq and 133bq, respectively. The lower layers 124p, 131p, 133ap and 133bp are made of an aluminum-based metal, such as aluminum (Al) or an aluminum alloy, for example, but are not limited thereto. The upper layers 124q, 131q, 133aq and 133bq are made of a molybdenum-based metal such as molybdenum (Mo) or a molybdenum alloy, a copper-based metal such as copper (Cu) or a copper alloy, a titanium-based metal such as titanium(Ti) or a titanium nitride(TiN) or other appropriate metal and/or alloy. Alternative exemplary embodiments may use different metals and/or metal alloys. For example, but not being limited thereto, aluminum-neodymium ("Al—Nd"), which contains aluminum (Al) and a predetermined amount of neodymium (Nd), may be used as the aluminum-based metal. According to an exemplary embodiment, a thickness of the lower layers 124p, 131p, 133ap and 133bp may be in a range of about 1000 Å to about 5000 Å, and a thickness of the upper layers 124q, 131q, 133aq and 133bq may be in a range of about 50 Å to about 2000 Å.

In an exemplary embodiment of the present invention, side surfaces of the gate lines 121 and storage electrodes 131a and 131b are inclined with respect to the substrate 110 at an angle of inclination which is in a range of about 30° to about 80°.

A gate insulating layer 140 which is made of silicon nitride ("SiNx") or silicon oxide ("SiOx") is formed on the gate lines 121 and the storage electrode lines 131.

A plurality of semiconductor strips 151 made of amorphous silicon ("a-Si") are formed on the gate insulating layer 140.

The semiconductor strips 151 generally extend in a substantially vertical direction, and include a plurality of projections 154 protruding toward the gate electrodes 124 as illustrated in FIG. 1. Each of the semiconductor strips 151 has a portion, in the vicinity of the gate lines 121 and the storage electrode lines 131, which has a larger width than other portions of the semiconductor strip 151 to cover the gate lines 121 and the storage electrode lines 131.

A plurality of source ohmic contacts 163 and drain ohmic contacts 165 are formed on the semiconductor strips 151. The source ohmic contacts 163 and the drain ohmic contacts 165 may be made of n+ hydrogenated amorphous silicon in which n-type impurities, such as phosphorus, are doped at high concentration. In alternative exemplary embodiments, the source ohmic contacts 163 and the drain ohmic contacts 165 may be made of a silicide, but are not limited thereto.

In an exemplary embodiment, side surfaces of the semiconductor strips 151, source ohmic contacts 163 and drain ohmic contacts 165 are inclined with respect to the substrate 110 at an angle of inclination in a range of about 30° to about 80°.

A plurality of data lines 171 and a plurality of drain electrodes 175 are formed on the source ohmic contacts 163, the drain ohmic contacts 165 and the gate insulating layer 140.

The data lines 171 transmit data signals, and generally extend in a substantially vertical direction to cross the gate lines 121 as illustrated in FIG. 1. Each of the data lines 171 also crosses the storage electrode lines 131, and is provided between the storage electrodes 133a and 133b. Each of the data lines 171 includes a plurality of source electrodes 173 which extend toward the gate electrodes 124 and a data line end portion 179 which is larger than the data line 171 to facilitate connections to another layer or an outside driving circuit. A data driving circuit (not shown) for generating data signals may be mounted on a flexible printed circuit film (not shown) attached on the substrate 110, may be directly mounted on the substrate 110, or may be integrated into the substrate 110, for example, but is not limited thereto. When the data driving circuit is integrated into the substrate 110, the data lines 171 may extend to be directly connected to the data driving circuit.

As illustrated in FIG. 2, the drain electrodes 175 are not connected to the data lines 171. Further, the drain electrodes 175 are separated from source electrodes 173 by the gate electrodes 124.

Referring to FIG. 1, the drain electrodes 175 include an end portion having a large area relative to the other portions of the drain electrode 175 located in the vicinity of the storage electrode line 131 and another relatively smaller end portion located near the gate electrode 124. The end portion having the large area overlaps the storage electrode line 131, and the other end portion having a relatively smaller area is partially surrounded by the source electrodes 173 which is bent to have a "U" shape around the relatively smaller end portion of the drain electrode 175, as illustrated in FIG. 1.

The gate electrode 124, the source electrode 173, the drain electrode 175 and the projection 154 of the semiconductor strip 151 form a TFT which has a channel provided to the projection 154 between the source electrode 173 and the drain electrode 175, as illustrated in FIG. 2.

Each of the data lines 171 has a three-layer structure which includes a lower layer 171p, a middle layer 171q and an upper layer 171r. Each of the source electrodes 173 has a three-layer structure which includes a lower layer 173p, a middle layer 173q and an upper layer 173r. Each of the drain electrodes 175 has a three-layer structure which includes a lower layer 175p, a middle layer 175q and an upper layer 175r. Each of the data line end portions 179 has a three-layer structure which includes a lower layer 179p, a middle layer 179q and an upper layer 179r. The lower layers 171p, 173p, 175p and 179p are made of, for example, but are not limited thereto, pure molybdenum (Mo) or a molybdenum-based metal such as a molybdenum alloy including molybdenum nitride ("MoN"), molybdenum-niobium ("MoNb"), molybdenum-vanadium ("MoV"), molybdenum-titanium ("MoTi"), or molybdenum-tungsten ("MoW") or pure titanium or titanium nitride("TiN"). The middle layers 171q, 173q, 175q and 179q are made of, for example, but are not limited thereto, an aluminum alloy such as aluminum (Al) or aluminum-neodymium ("AlNd") which has a low resistivity. The upper layers 171r, 173r, 175r and 179r are made of, for example, but are not limited thereto, pure molybdenum or a molybdenum-based metal such as a molybdenum alloy including molybdenum nitride ("MoN"), molybdenum-niobium ("MoNb"), molybdenum-vanadium ("MoV"), molybdenum-titanium ("MoTi"), molybdenum-tungsten ("MoW") or pure titanium or titanium nitride("TiN"), which have excellent contact characteristics with indium tin oxide ("ITO") or indium zinc oxide ("IZO").

Referring to FIGS. 2 and 3, the lower layers of the data lines 171, the source electrodes 173, the drain electrodes 175 and the data line end portions 179 are identified by the letter "p", the middle layers thereof are identified by the letter "q", and the upper layers thereof are indicated by identified by the letter "r".

In exemplary embodiment, side surfaces of the data lines 171 and drain electrodes 175 are inclined with respect to the substrate 110 at an angle of inclination in a range of about 30° to about 80°.

Referring again to FIG. 2, the source ohmic contacts 163 are provided between the semiconductor strips 151 and the source electrodes 173 to lower the contact resistance therebetween, and the drain ohmic contacts 165 are provided between the semiconductor strips 151 and the drain electrodes 175 and storage electrode lines 131 to lower the contact resistance therebetween.

As illustrated in FIG. 1, the semiconductor strips 151 are generally narrower than the data lines 171. However, as described above, the semiconductor strips 151 have relatively larger widths in the vicinity of the TFTs to prevent the data lines 171 from being disconnected from the TFTs. Therefore, the semiconductor strips 151 have exposed portions, e.g., portions not covered with the data lines 171 and the drain electrodes 175, as well as exposed portions between the source electrodes 173 and the drain electrodes 175.

As illustrated in FIGS. 2 and 3, a passivation layer 180 is formed on the data lines 171, the source electrodes 173, the drain electrodes 175, the gate line end portions 129, the data line end portions 179 and the exposed portions of the semiconductor strips 151. The passivation layer 180 has a dual-layered structure, which includes a lower inorganic layer 180p and an upper organic layer 180q which has excellent insulating characteristics to protect the exposed portions of the semiconductor strips 151. However, the passivaton layer 180 may be a single inorganic layer.

In an exemplary embodiment of the present invention, a portion of the passivation layer 180 over an exposed area of the gate line end portions 129 of the gate lines 121 is formed into a porous structure 180r (FIG. 3 only) to minimize an exposed area of a connection portion between gate line contact assistants 81 and the gate line end portions 129 of the gate lines 121, thereby effectively reducing or eliminating corrosion of the exposed area.

The passivation layer 180 includes a plurality of data line end portion contact holes 182 and a plurality of drain electrode contact holes 185 through which the data line end portions 179 of the data line 171 and the drain electrode 175 are exposed, respectively. Further, the passivation layer 180 and the gate insulating layer 140 include a plurality of gate line end portion contact holes 181 through which the gate line end portion 129 of the gate line 121 is exposed, and a plurality of storage electrode contact holes 184 through which the storage electrode lines 131 in the vicinity of the fixed end of the storage electrode 133b are exposed.

A plurality of pixel electrodes 191, a plurality of overpasses 84, a plurality of gate line contact assistants 81 and a plurality of data line contact assistants 82 are formed on the passivation layer 180. Each of the pixel electrodes 191, overpasses 84, and contact assistants 82 may be made of a transparent conductive material such as ITO or IZO, or a reflective metal such as aluminum or silver, or alloys thereof, for example, but is not limited thereto.

Referring again to FIG. 1, the overpass 84 crosses the gate line 121 and connects to the exposed portion of the storage electrode line 131 and the end portion of the free end of the storage electrode 133b through the storage electrode contact holes 184 which are positioned on both sides of the gate line 121. Thus, the arrangement of the overpass 84 and the storage electrodes 133a and 133b and the storage electrode line 131 compensate for defective connections in the gate line 121, data line 171, or TFT. The pixel electrodes 191 are physically and electrically connected to the drain electrodes 175 through the drain electrode contact holes 185, and data voltages are applied to the pixel electrodes 191 from the drain electrodes 175. When the data voltages are applied to the pixel electrodes 191, an electric field is generated between common electrodes (not shown) of another filter display panel (not shown) to which a common voltage is applied to determine an alignment of liquid crystal molecules in a liquid crystal layer (not shown) interposed between the pixel electrodes 191 and the common electrodes. Further, the pixel electrodes 191 and the common electrodes form a capacitor (hereinafter, referred to as a "liquid crystal capacitor") which maintains the applied data voltage even after the TFT is turned off.

The pixel electrodes 191 overlap the storage electrodes 133a and 133b and the storage electrode lines 131, as illustrated in FIG. 1. More specifically, the pixel electrode 191 and the drain electrode 175, which is electrically connected to the pixel electrode 191, overlap the storage electrode line 131 to form a capacitor, referred to as a storage capacitor. The storage capacitor improves a voltage holding characteristic of the liquid crystal capacitor.

The gate line contact assistants 81 and data line contact assistants 82 are connected to the gate line end portion 129 of the gate line 121 and the data line end portion 179 of the data line 171 through the gate line end portion contact holes 181 and data line end portion contact holes 182, respectively. As described above, a portion of the passivation layer 180 corresponding to the gate line end portion 129 of the gate line 121 is formed into the porous structure 180r (FIG. 3). Therefore, the gate line contact assistants 81 and the gate line end portion 129 of the gate line 121 are connected to each other such that an exposed area of the gate line end portion 129 of the gate line 121 is minimized, resulting in an improved corrosion resistance, e.g., corrosion of the exposed area of the gate line end portion 129 of the gate line 121 is effectively reduced or eliminated and reliability of the TFT array panel is thereby improved.

The gate line contact assistants 81 and the data line contact assistants 82 also improve the adhesive property between the gate line end portion 129 of the gate line 121 and an outside device, and between the data line end portion 179 of the data line 171 and an outside device. Further, the gate line contact assistants 81 and data line contact assistants 82 protect the gate line end portion 129 of the gate line 121 and the data line end portion 179 of the data line 171.

Hereinafter, a method of manufacturing the TFT array panel according to an exemplary embodiment of the present invention in FIGS. 1 to 3 will be described in further detail with reference to FIGS. 4 to 15.

FIGS. 4, 7, 10 and 13 are plan views illustrating sequential steps of a method of manufacturing a TFT array panel according to another exemplary embodiment of the present invention. FIGS. 5 and 6 are partial cross-sectional views taken along lines V-V' and VI-VI', respectively, illustrating an exemplary embodiment of a manufacturing process of the TFT array panel in FIG. 4. FIGS. 8 and 9 are partial cross-sectional views taken along lines VIII-VIII' and IX-IX', respectively, illustrating an exemplary embodiment of a manufacturing process of the TFT array panel in FIG. 7.

Figure 10:
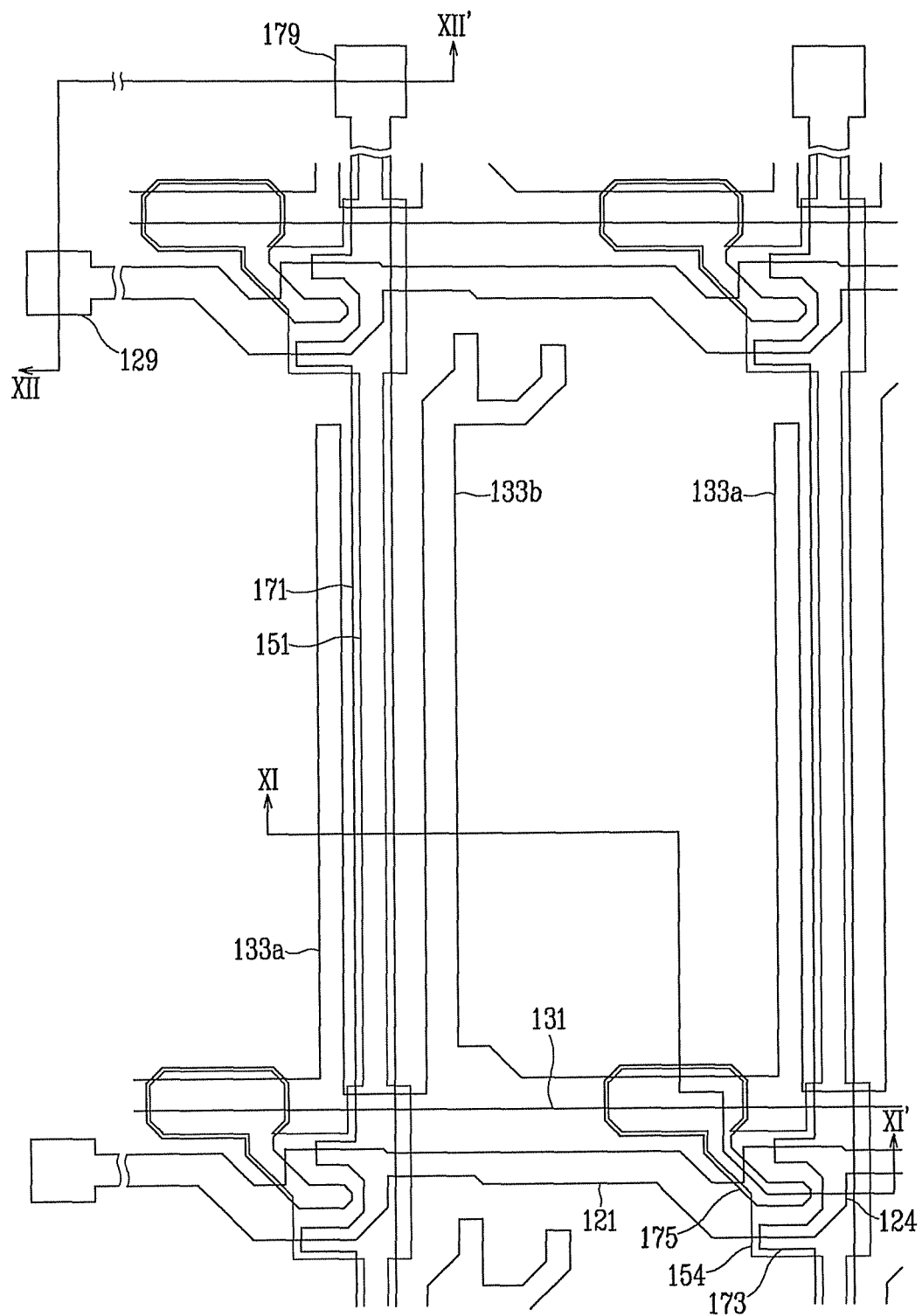
Figure 11:
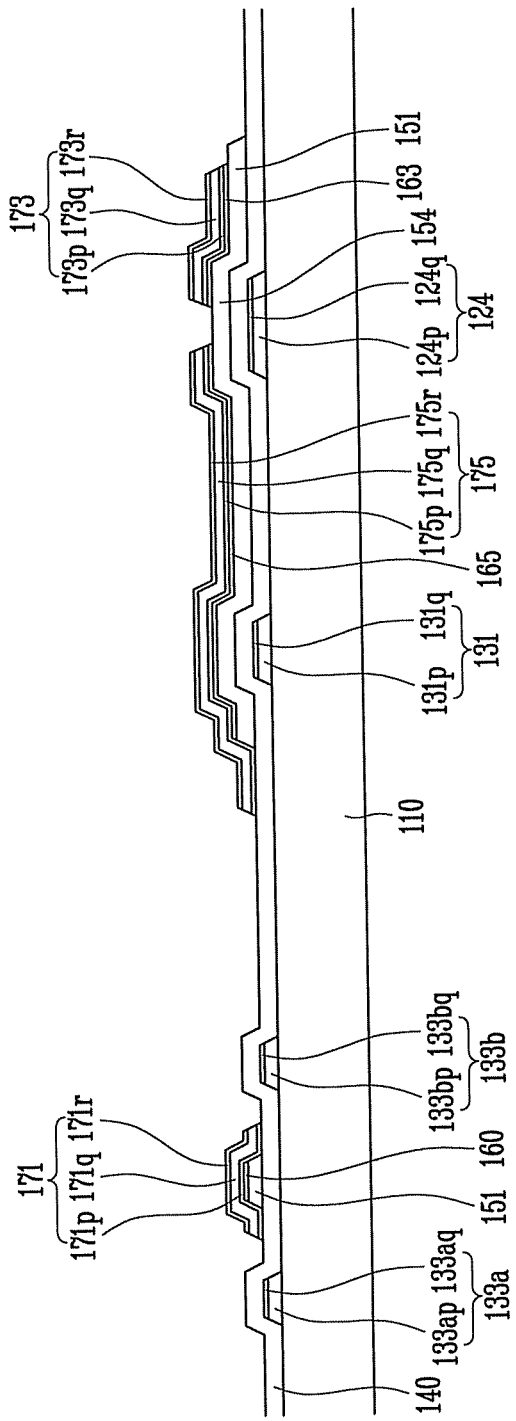
FIGS. 11 and 12 are partial cross-sectional views taken along lines XI-XI' and XII-XII', respectively, illustrating an exemplary embodiment of a manufacturing process of the thin film transistor array panel in FIG. 10.
Figure 12:
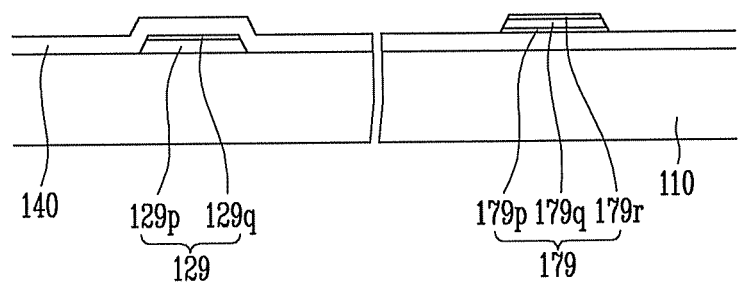

FIGS. 11 and 12 are partial cross-sectional views taken along lines XI-XI' and XII-XII', respectively, illustrating an exemplary embodiment of a manufacturing process of the TFT array panel in FIG. 10. FIGS. 14 and 15 are partial cross-sectional views taken along lines XIV-XIV' and XV-XV', respectively, illustrating an exemplary embodiment of a manufacturing process of the TFT array panel in FIG. 13.

Figure 4:
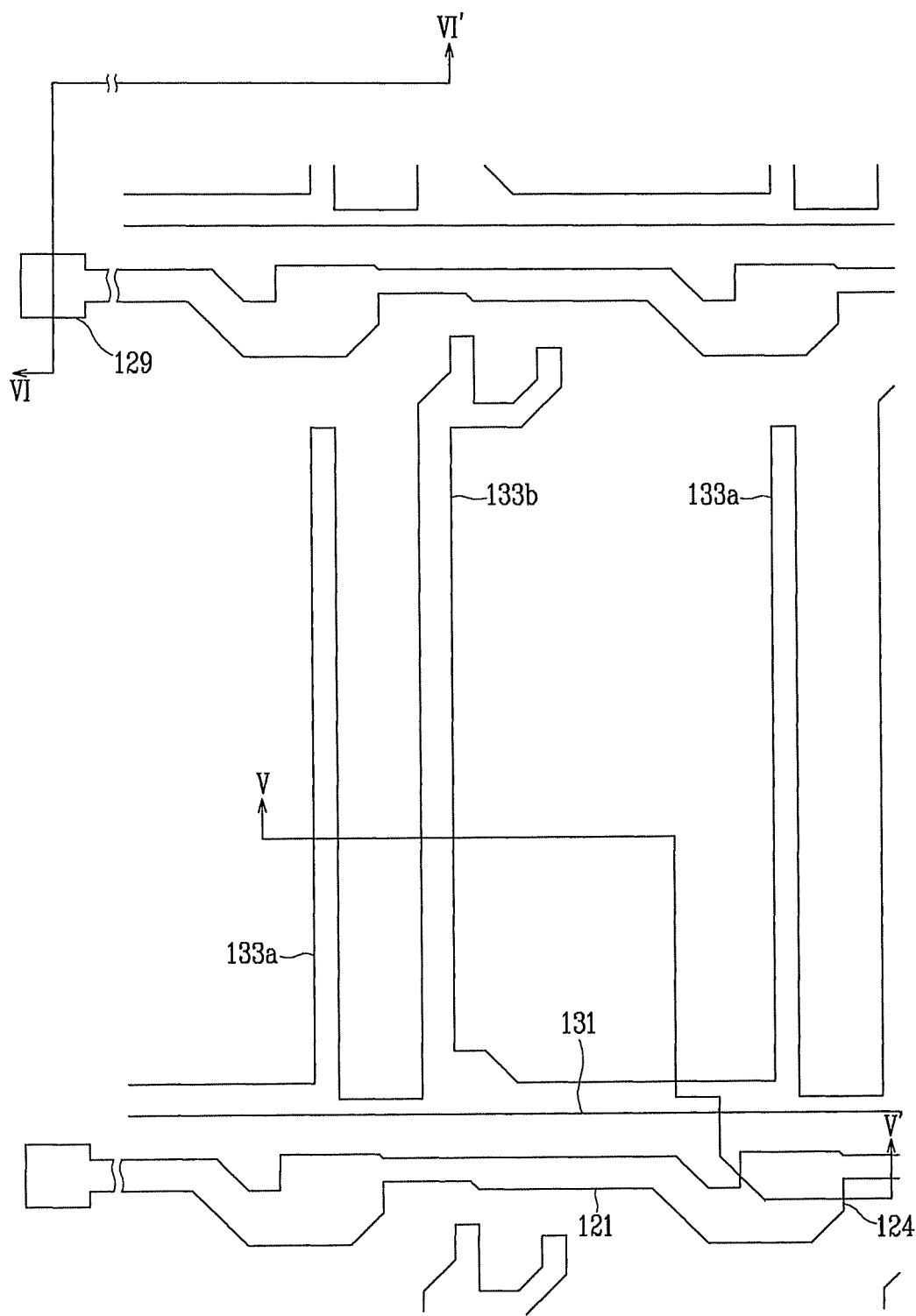
FIGS. 4, 7, 10 and 13 are plan views illustrating sequential steps of a method of manufacturing a thin film transistor array panel according to another exemplary embodiment of the present invention.
Figure 5:
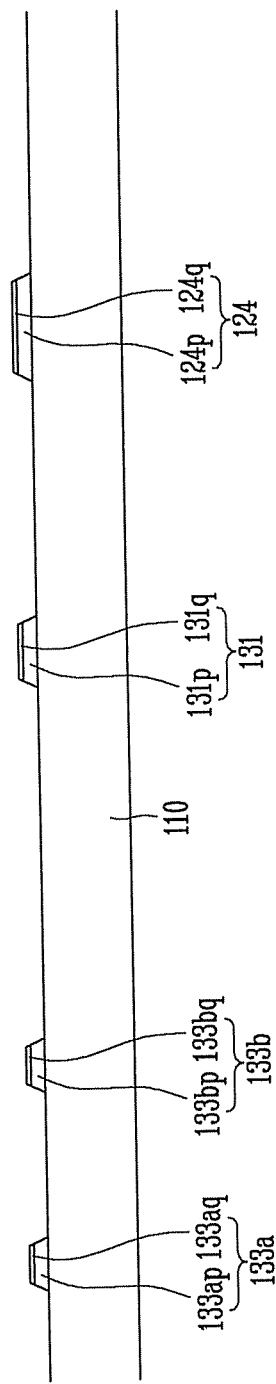
FIGS. 5 and 6 are partial cross-sectional views taken along lines V-V' and VI-VI', respectively, illustrating an exemplary embodiment of a manufacturing process of the thin film transistor array panel in FIG. 4.
Figure 6:
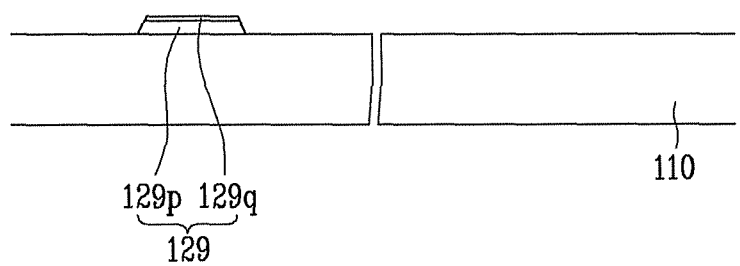

Referring to FIGS. 4 to 6, a lower layer (not fully shown) which is made of aluminum-neodymium ("AlNd") and an upper layer (not fully shown) which is made of a molybdenum-base material or a copper-based metal are sequentially laminated on an insulation substrate 110 made of transparent glass, plastic or other suitable material.

A wet etching is performed on the lower layer and the upper layer to form a plurality of gate lines 121 which include gate electrodes 124 having lower and upper portions 124p and 124q, respectively, and a plurality of gate line end portions 129 having lower and upper portions 129p and 129q, respectively (FIG. 3), and a plurality of storage electrode lines 131 having lower and upper portions 131p and 131q, respectively (FIG. 2) which include a storage electrode 133a having lower and upper portions 133ap and 133aq, respectively, and a storage electrode 133b having lower and upper portions 133bp and 133bq, respectively, (FIG. 2).

Figure 7:
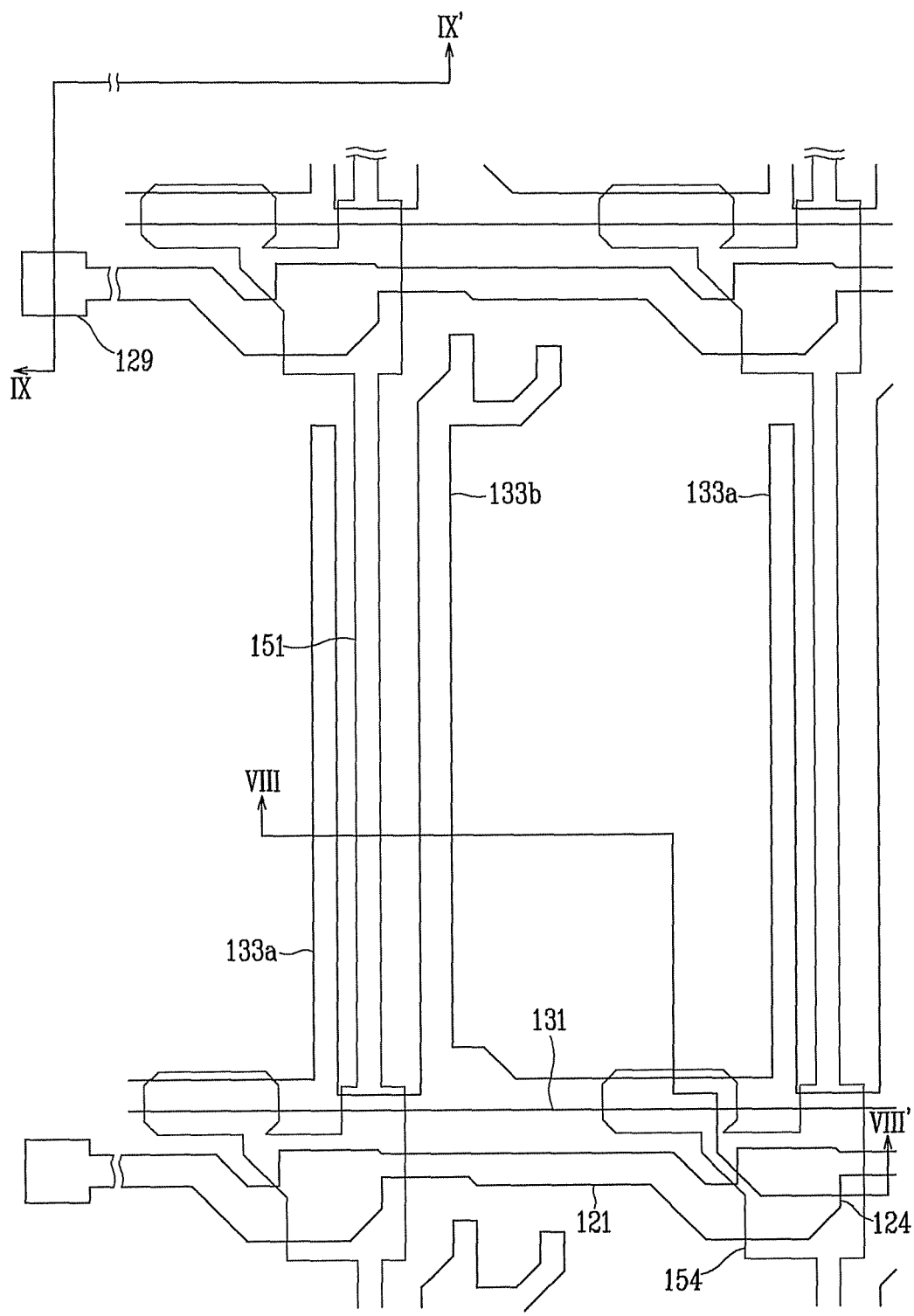
Figure 8:
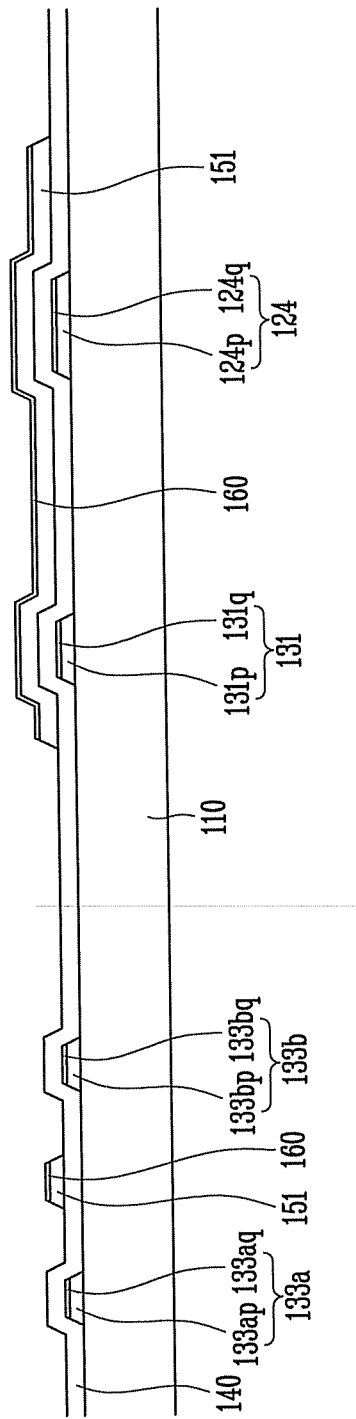
FIGS. 8 and 9 are partial cross-sectional views taken along lines VIII-VIII' and IX-IX', respectively, illustrating an exemplary embodiment of a manufacturing process of the thin film transistor array panel in FIG. 7.
Figure 9:
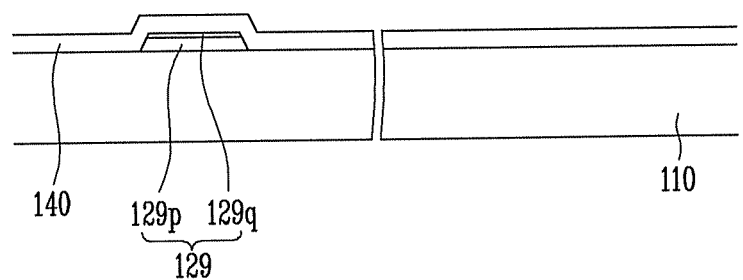

Referring to FIGS. 7 to 9, a gate insulating layer 140 made of SiNx, an intrinsic a-Si layer which is not doped with impurities, and an amorphous silicon ("n+ a-Si") layer which is doped with impurities are formed on the gate lines 121 and the storage electrode lines 131 using a plasma enhanced chemical vapor deposition ("PECVD") process.

As illustrated in FIGS. 7 to 9, the intrinsic A-Si layer and the n+ a-Si layer are etched using photolithography to form a semiconductor strip 151, the gate insulating layer 140, a plurality of projections 154 and an a-Si layer doped with impurities layer 160.

As illustrated in FIGS. 10 to 12, a data metal layer (not shown) which includes a lower molybdenum layer made of a molybdenum-based metal, a middle aluminum layer made of an aluminum-based metal, and an upper molybdenum layer made of a molybdenum-based metal is sequentially laminated onto the a-Si doped with impurities layer 160 using a sputtering method. Then, a wet etching is performed on the lower molybdenum layer, the middle aluminum layer and the upper molybdenum layer to form data lines 171, drain electrodes 175, source electrodes 173 and data line end portions 179. Note that the data lines 171, the drain electrodes 175, the source electrodes 173 and the data line end portions 179 include respective lower, middle and upper layers designated by the letters "p," "q," and "r," respectively, as described in further detail above.

The a-Si doped with impurities layer 160, which is exposed, e.g., is not covered with the source electrodes 173 and drain electrodes 175, is removed and a plurality of source ohmic contacts 163 and a plurality of drain ohmic contacts 165 are formed. Further, the projections 154 of the semiconductor strip 151 are exposed. In one exemplary embodiment of the present invention, an oxygen ("$O_2$") plasma process is performed to stabilize exposed surfaces of the projections 154 of the semiconductor strip 151.

Figure 13:
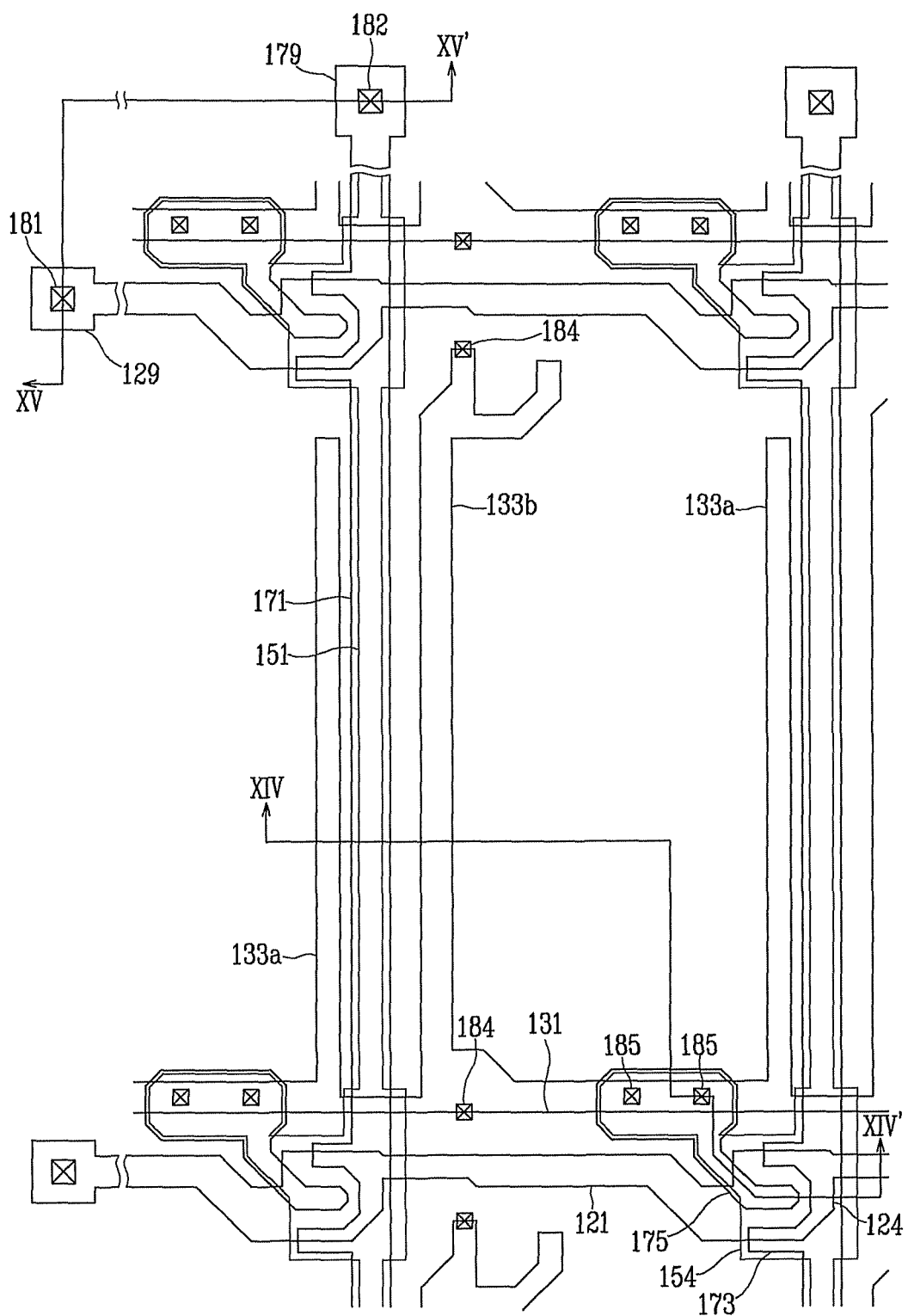
Figure 14:
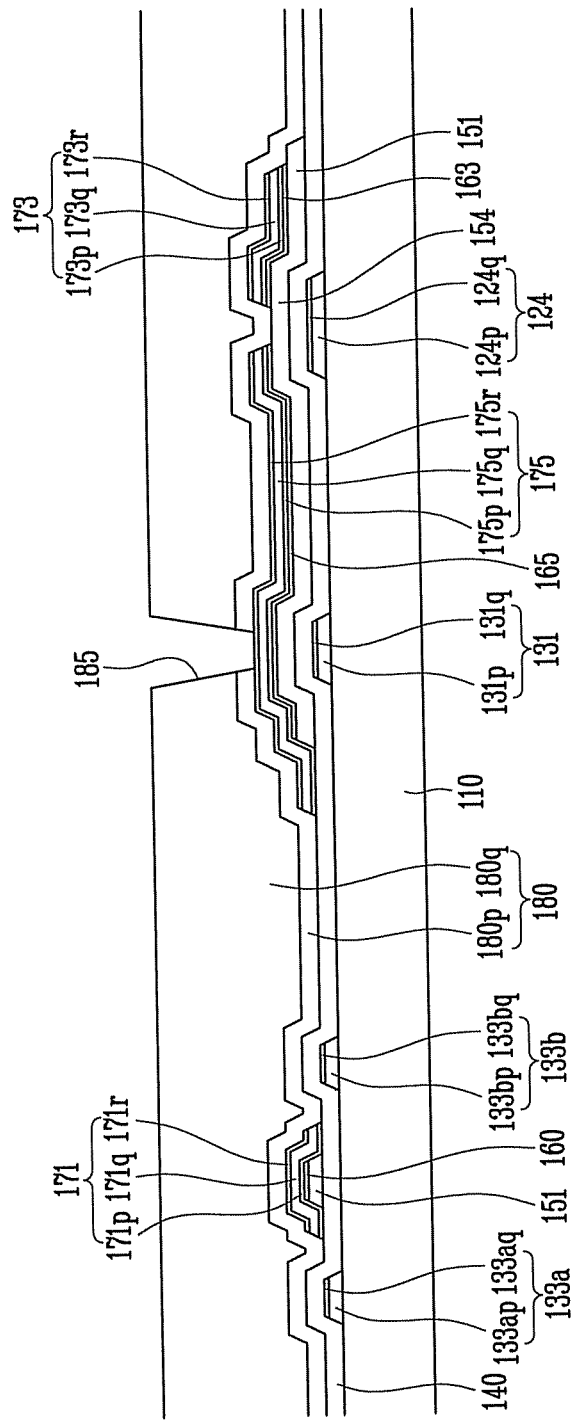
FIGS. 14 and 15 are partial cross-sectional views taken along lines XIV-XIV' and XV-XV', respectively, illustrating an exemplary embodiment of a manufacturing process of the thin film transistor array panel in FIG. 13.
Figure 15:
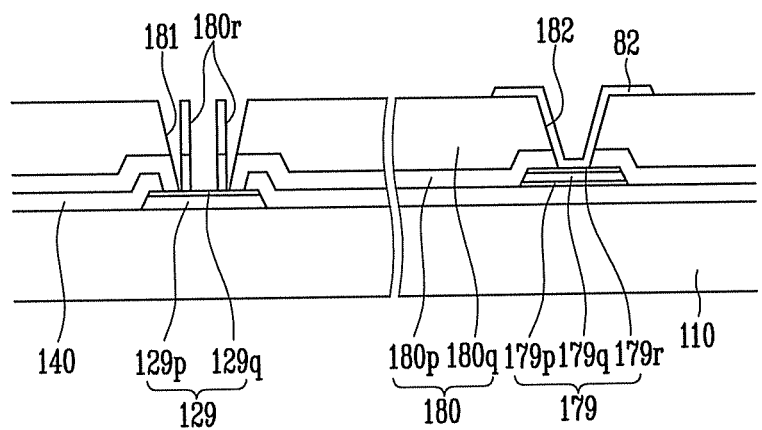

A passivation layer 180 is then formed on the data lines 171, the source electrodes 173, the drain electrodes 175, the gate line end portions 129, the data line end portions 179 and the exposed portions of the semiconductor strips 151 as illustrated in FIGS. 13 to 15. The passivation layer 180 has a dual-layered structure which includes a lower inorganic layer 180p and an upper organic layer 180q which has excellent insulating characteristics to protect the exposed portions of the semiconductor strips 151. However, the passivation layer 180 may be a single inorganic layer.

Next, a photosensitive film (not shown) is coated on the passivation layer 180 and light is radiated onto the photosensitive film through an optical mask (not shown). Thus, the photosensitive film is developed to form a plurality of gate line end portion contact holes 181, a plurality of data line end portion contact holes 182, a plurality of storage electrode contact holes 184 and a plurality of drain electrode contact holes 185. Further, a portion of the passivation layer 180 of the gate line end portion contact hole 181 at the gate line end portion 129 of the gate line 121 is formed into a porous structure 180r (FIG. 15) such that an exposed area of the gate line end portions 129 of the gate lines 121 is minimized when the gate line end portions 129 of the gate lines 121 are connected to the gate line contact assistants 81.

Finally, referring back to FIGS. 1 to 3, a transparent conductive layer such as ITO, but not being limited thereto, is laminated on the passivation layer 180 using a sputtering method, and is patterned to form a pixel electrode 191, gate line contact assistants 81, data line contact assistants 82 and an overpass 84 as described in greater detail above.

Hereinafter, a TFT array panel according to another exemplary embodiment of the present invention will be described in further detail with reference to FIGS. 16 to 18.

Figure 16:
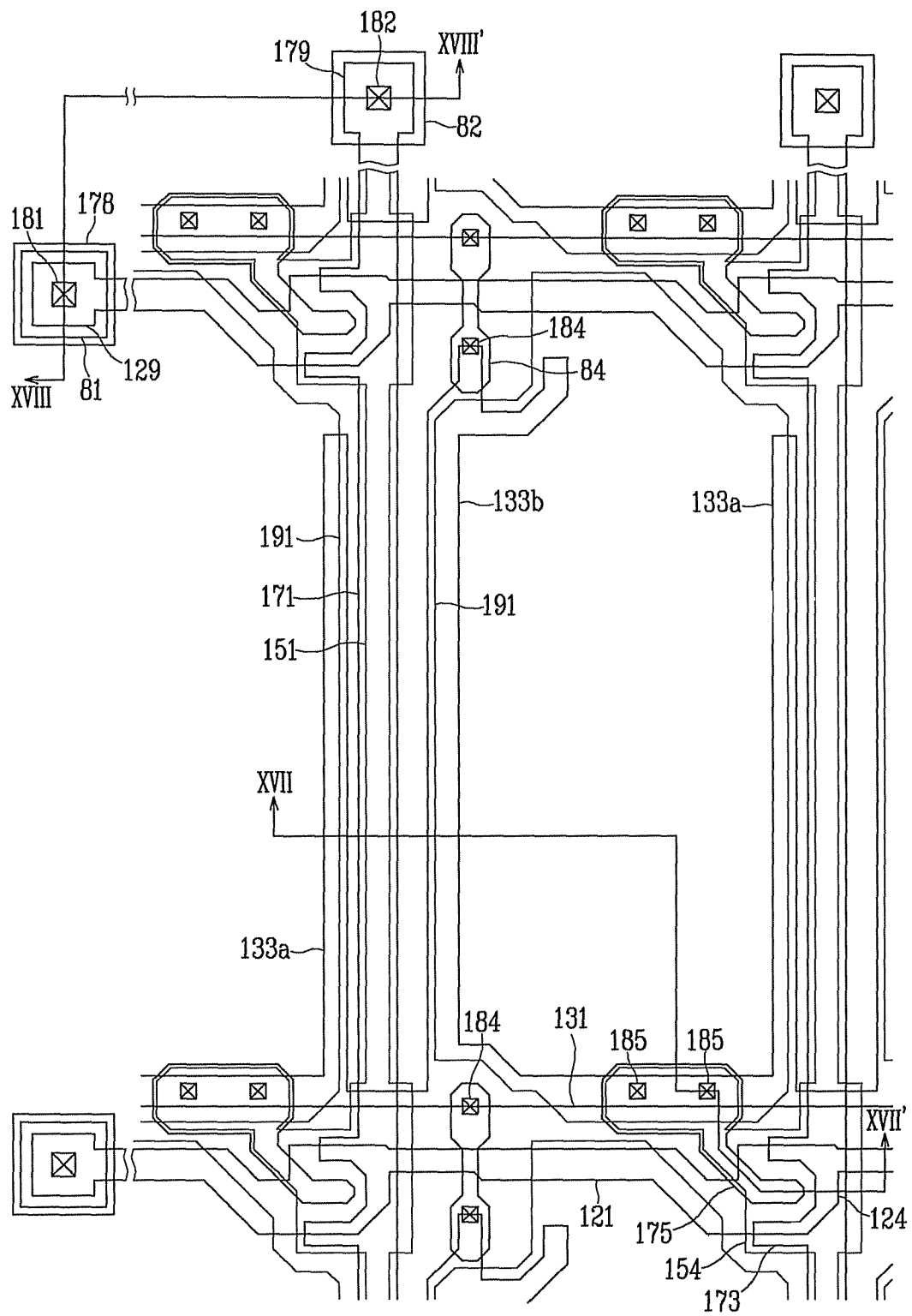
FIG. 16 is a plan view of a thin film transistor array panel according to another exemplary embodiment of the present invention.
Figure 17:
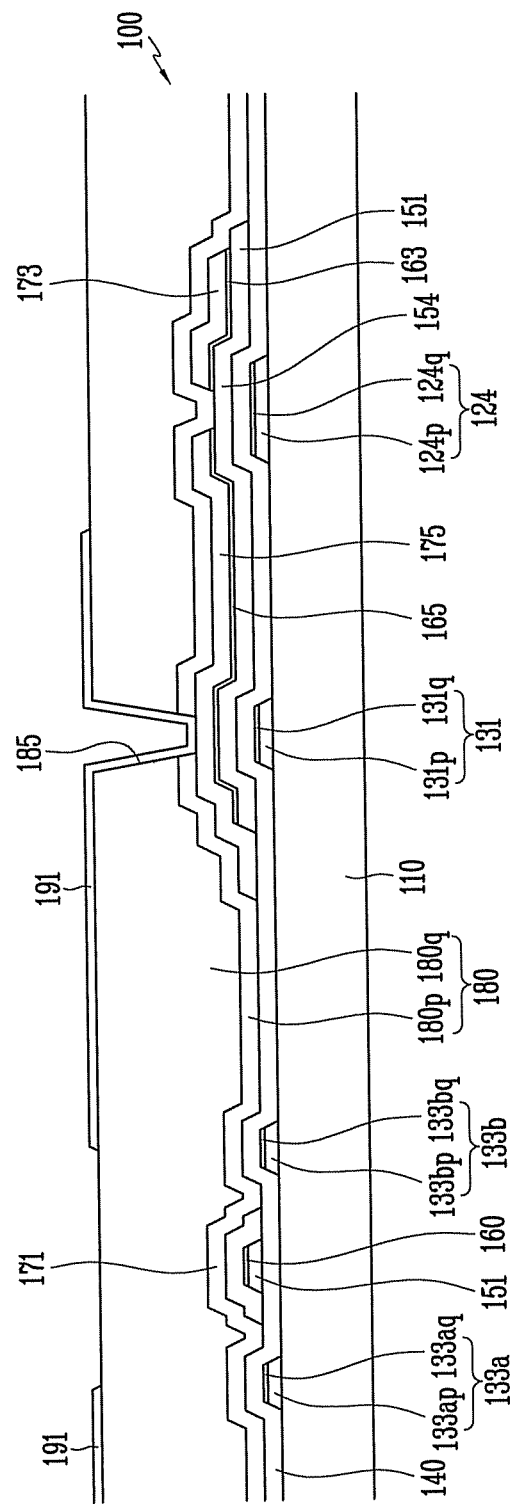
FIGS. 17 and 18 are partial cross-sectional views taken along lines XVII-XVII' and XVIII-XVIII', respectively, illustrating an exemplary embodiment of the thin film transistor array panel in FIG. 16.
Figure 18:
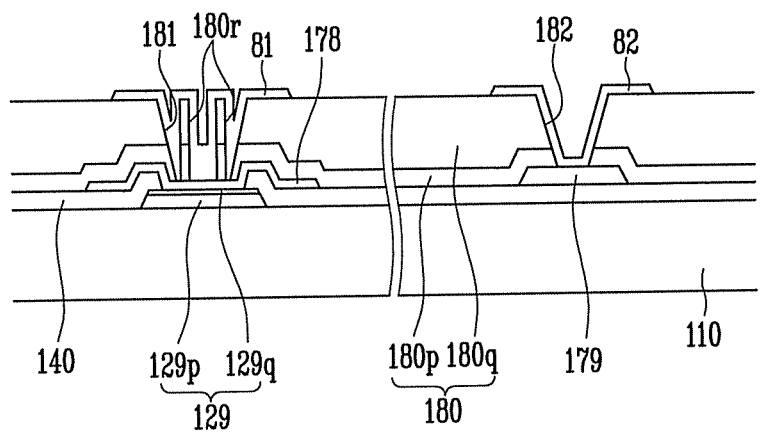

FIG. 16 is a plan view of a TFT array panel according to another exemplary embodiment of the present invention, and FIGS. 17 and 18 are partial cross-sectional views taken along lines XVII-XVII' and XVIII-XVIII', respectively, illustrating an exemplary embodiment of the TFT array panel in FIG. 16.

The TFT array panel 100 according to the present exemplary embodiment has substantially the same structure as that illustrated in FIGS. 1 to 3 and includes a plurality of gate lines 121, gate electrodes 124 having lower layers 124p and upper layers 124q, gate line end portions 129 having lower layers 129p and upper layers 129q, and a plurality of storage electrode lines 131, having lower layers 131p and upper layers 131q and which include storage electrodes 133a and 133b, formed on a substrate 110. The storage electrodes 133a and 133b further include lower layers 133ap and 133bp, respectively, and upper layers 133aq and 133bq, respectively. A gate insulating layer 140, a plurality of semiconductor strips 151 including projections 154, a plurality of source ohmic contacts 163 and a plurality of drain ohmic contacts 165 are sequentially formed on the gate lines 121 and the storage electrode lines 131.

A plurality of drain electrodes 175 and a plurality of data lines 171 which include source electrodes 173 and data line end portions 179 are formed on the source ohmic contacts 163 and the drain ohmic contacts 165, and a passivation layer 180 is formed on the drain electrodes 175 and the data lines 171. The passivation layer 180 has a dual-layered structure which includes a lower inorganic layer 180p and an upper organic layer 180q which has excellent insulating characteristics to protect exposed portions of the semiconductor strips 151. However, the passivation layer 180 may be a single inorganic layer.

The passivation layer 180 may have a contact hole with a porous structure 180r which minimizes an exposed area of the corrosion protecting layer when the corrosion protecting layer is connected to the gate line contact assistants 81.

A plurality of gate line end portion contact holes 181, a plurality of data line end portion contact holes 182, a plurality of storage electrode contact holes 184 and a plurality of drain electrode contact holes 185 are formed in the passivation layer 180 and the gate insulating layer 140. Further, a plurality of pixel electrodes 191, a plurality of gate line contact assistants 81, a plurality of data line contact assistants 82 and a plurality of overpasses 84 are formed on the passivation layer 180 and gate insulating layer 140, as described above. The contact hole formed on the passivation layer 180 may have a porous structure 180r, and therefore, a porous connection structure may be formed when the gate line contact assistants 81 and the corrosion protecting layer 178 are connected to each other. As a result, an improved corrosion resistance is obtained since an exposed area of the corrosion protecting layer 178 is minimized, as described in greater detail above.

The TFT array panel 100 according to the present alternative exemplary embodiment is different from the TFT array panel in FIGS. 1 to 3 as follows. To further reduce or eliminate corrosion when a flexible printed circuit substrate and the TFT array panel are connected to each other, the end portion of the gate line 121 is partially exposed by etching a part of the lower gate insulating layer 140, and then a corrosion protecting layer 178 is formed such that the exposed area of the gate line 121 is covered by the corrosion protecting layer 178. The corrosion protecting layer 178 may be formed of a molybdenum-based metal, such as pure molybdenum and molybdenum alloy, a copper-based metal such as pure copper and copper alloy, a titanium-based metal such as pure titanium, titanium alloy, and titanium nitride or a chromium-based metal such as pure chromium and chromium alloy Hereinafter, a method of manufacturing a TFT array panel according to another exemplary embodiment of the present invention will be described with reference to FIGS. 19 to 31.

FIGS. 19, 22, 25 and 28 are plan views illustrating sequential steps of a method of manufacturing a TFT array panel according to another exemplary embodiment of the present invention. FIGS. 20 and 21 are partial cross-sectional views of the TFT array panel in FIG. 19, taken along lines XX-XX' and XXI-XXI', respectively, illustrating an exemplary embodiment of a manufacturing process of the TFT array panel in FIG. 19. FIGS. 23 and 24 are partial cross-sectional views taken along lines XXIII-XXIII' and XXIV-XXIV', respectively, illustrating an exemplary embodiment of a manufacturing process of the TFT array panel in FIG. 22.

Figure 25:
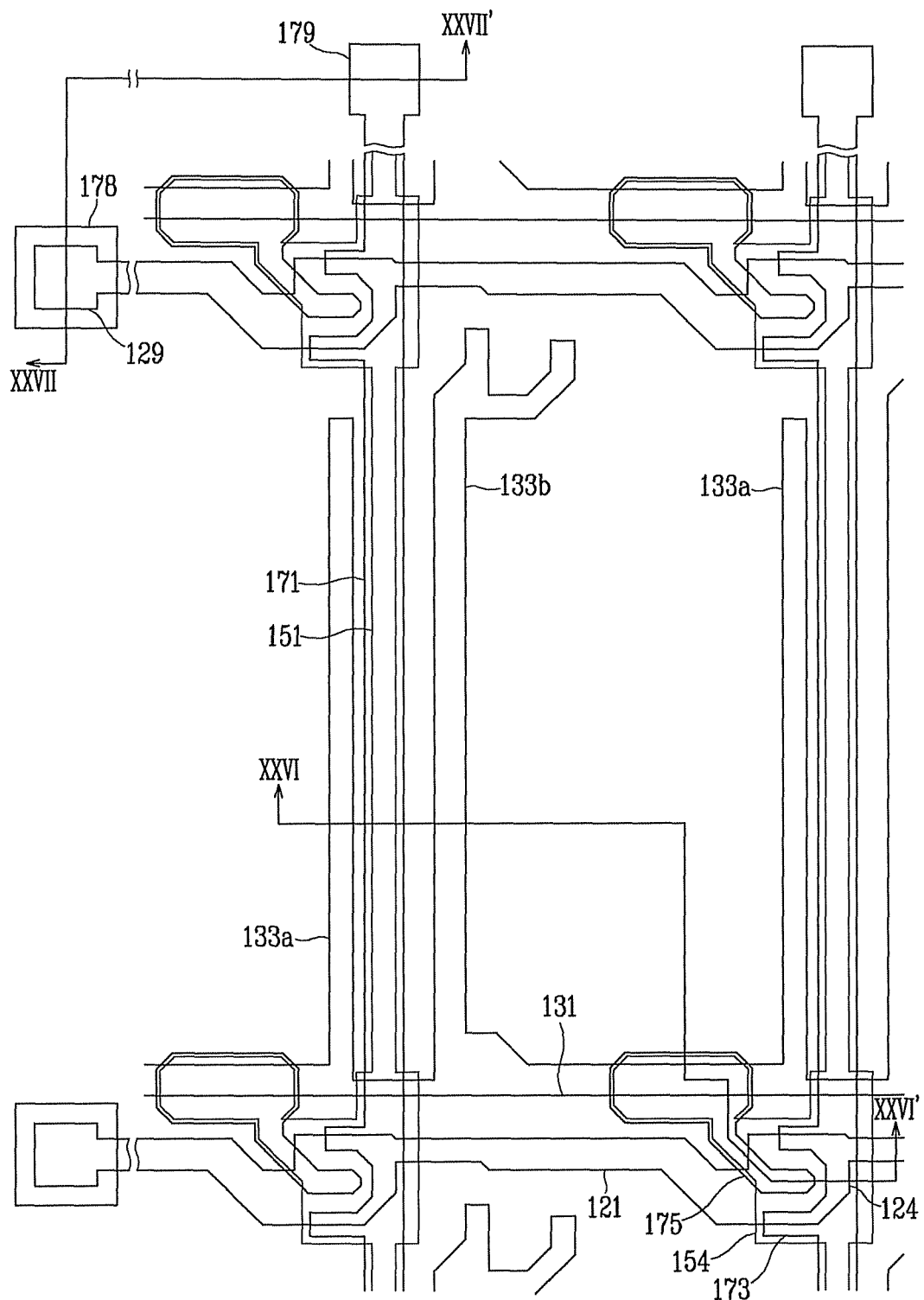
Figure 26:
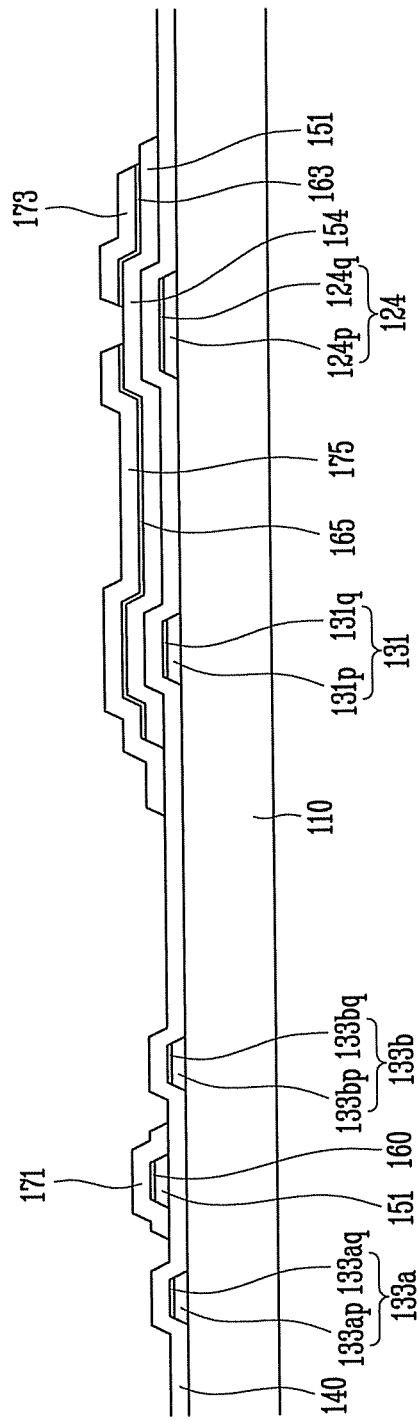
FIGS. 26 and 27 are partial cross-sectional views taken along the lines XXVI-XXVI' and XXVII-XXVII', respectively, illustrating an exemplary embodiment of a manufacturing process of the thin film transistor array panel in FIG. 25.
Figure 27:
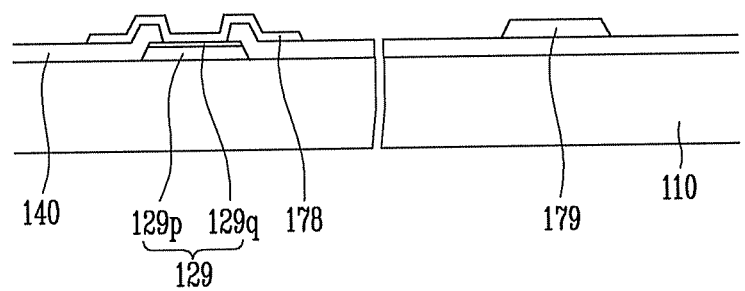

FIGS. 26 and 27 are partial cross-sectional views taken along lines XXVI-XXVI' and XXVII-XXVII', respectively, illustrating an exemplary embodiment of a manufacturing process of the TFT array panel in FIG. 25. FIGS. 29 and 30 are partial cross-sectional views taken along lines XXIX-XXIX' and XXX-XXX', respectively, illustrating an exemplary embodiment of a manufacturing process of the TFT array panel in FIG. 28. FIG. 31 is an enlarged view of porous connecting portions of a TFT array panel according to an exemplary embodiment of the present invention and a TFT array panel according to another exemplary embodiment of the present invention.

Figure 19:
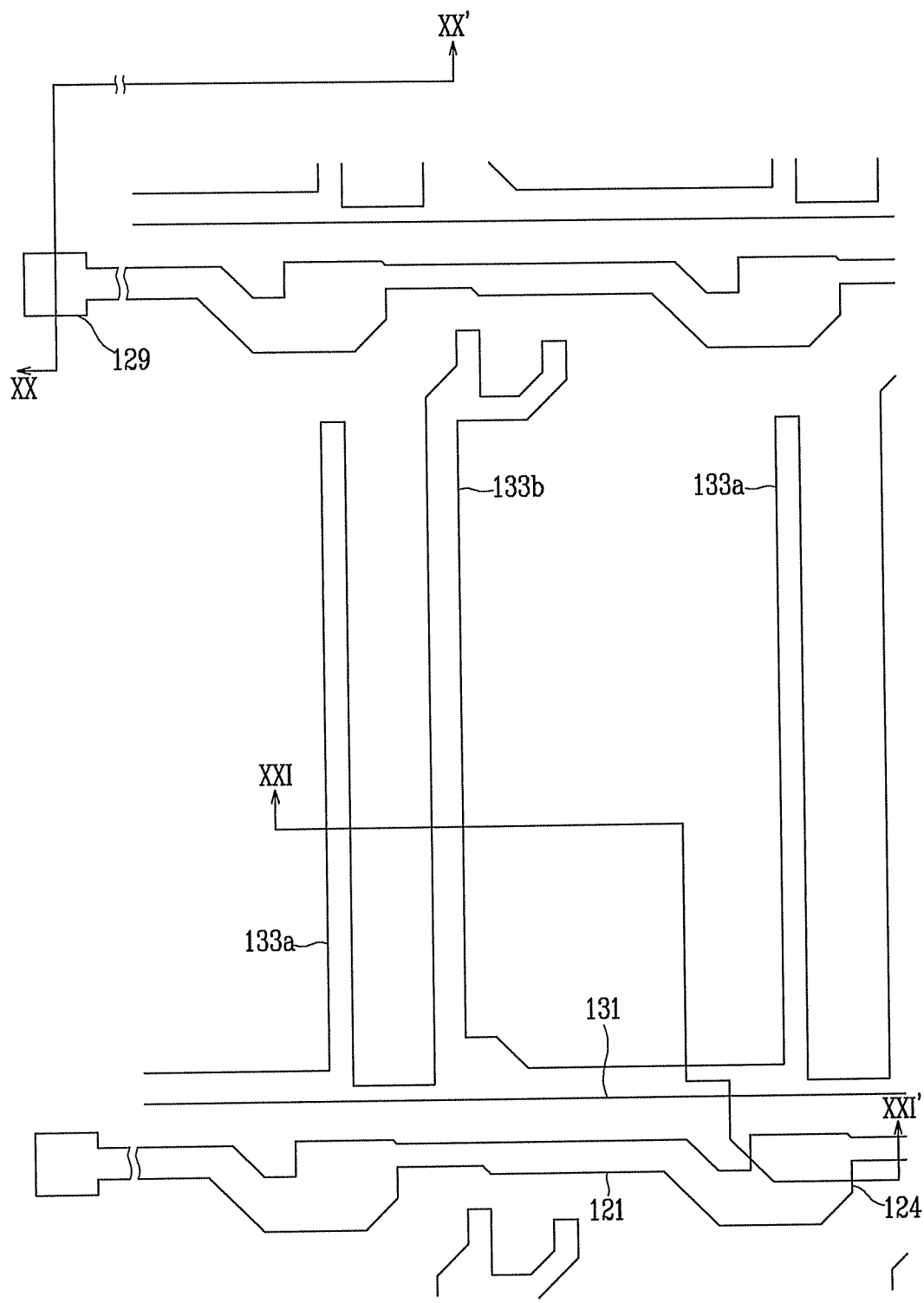
FIGS. 19, 22, 25 and 28 are plan views illustrating sequential steps of a method of manufacturing a thin film transistor array panel according to another exemplary embodiment of the present invention.
Figure 20:
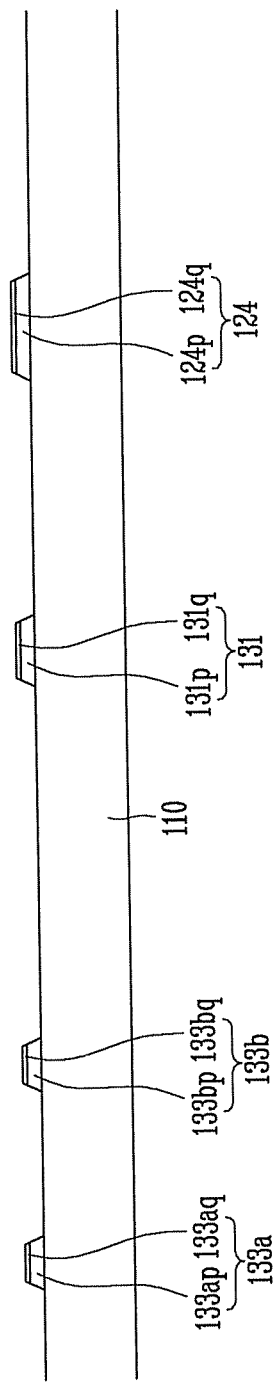
FIGS. 20 and 21 are partial cross-sectional views taken along lines XX-XX' and XXI-XXI', respectively, illustrating an exemplary embodiment of a manufacturing process of the thin film transistor array panel in FIG. 19.
Figure 21:
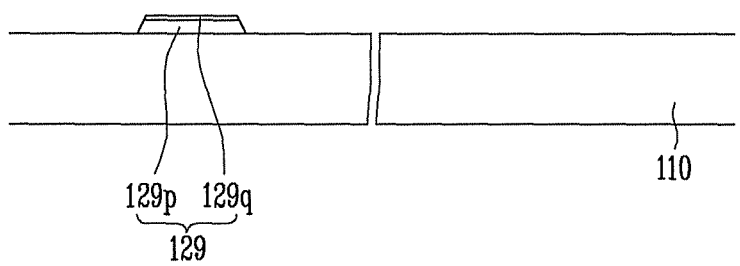

First, as illustrated in FIGS. 19 to 21, a lower layer (not fully shown) which is made of aluminum-neodymium ("AlNd"), and an upper layer (not fully shown) which is made of a molybdenum-base material or a copper-based metal are sequentially laminated on an insulation substrate 110 made of transparent glass or plastic, for example, but are not limited thereto.

Then, a wet etching is performed on the lower layer and upper layer to form a plurality of gate lines 121, gate electrodes 124 having lower layers 124p and upper layers 124q, gate line end portions 129 having lower layers 129p and upper layers 129q, and a plurality of storage electrode lines 131 having lower layers 131p and upper layers 131q, and which include storage electrodes 133a and 133b, formed on a substrate 110. The storage electrodes 133a and 133b further include lower layers 133ap and 133bp, respectively, and upper layers 133aq and 133bq, respectively.

Figure 22:
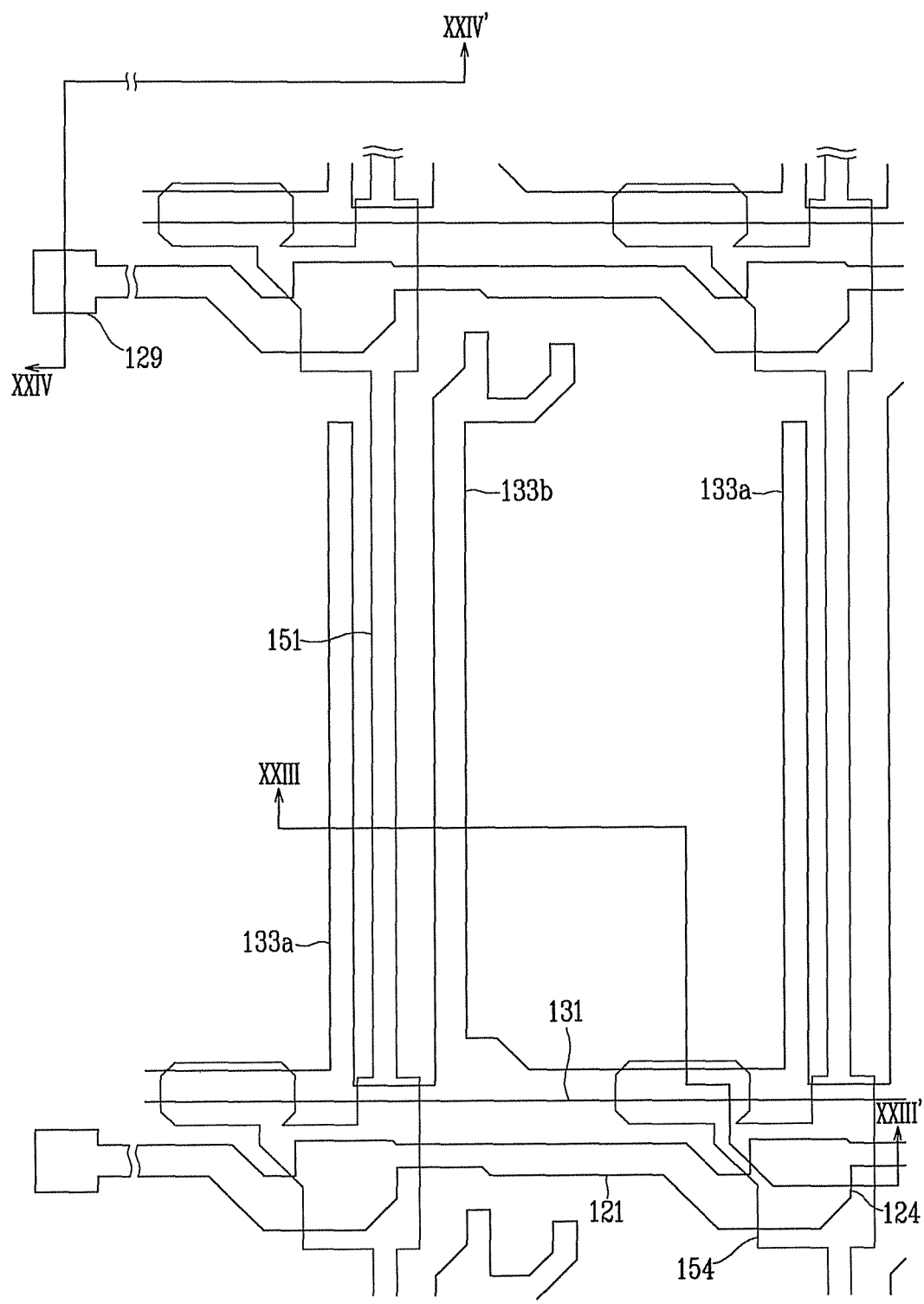
Figure 23:
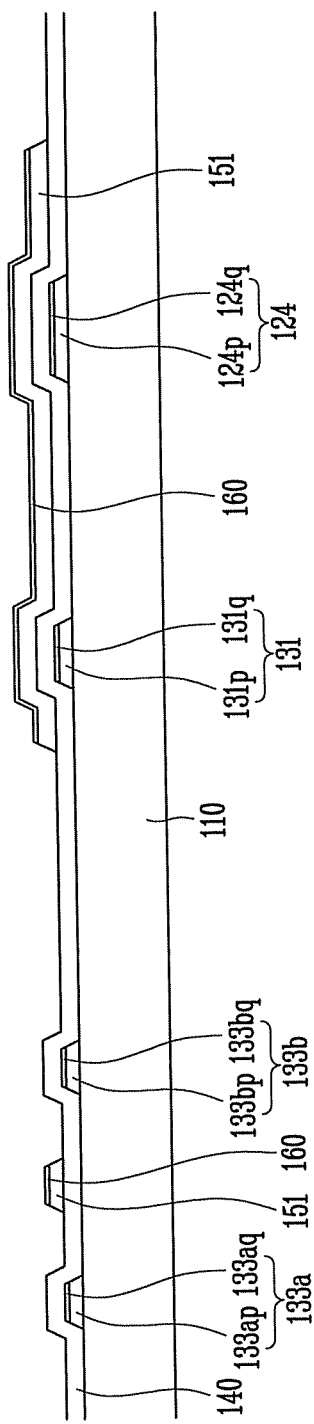
FIGS. 23 and 24 are partial cross-sectional views taken along lines XXIII-XXIII' and XXIV-XXIV', respectively, illustrating an exemplary embodiment of a manufacturing process of the thin film transistor array panel in FIG. 22.
Figure 24:
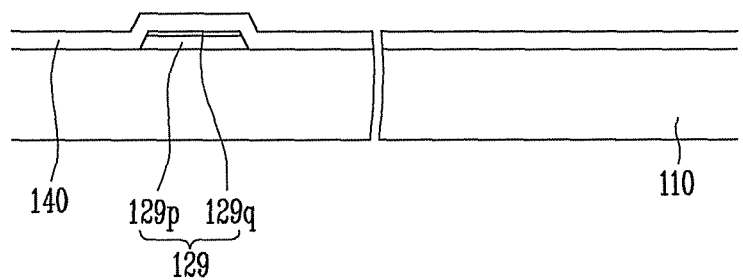

Subsequently, as illustrated in FIGS. 22 to 24, an amorphous silicon doped with impurities and an intrinsic amorphous silicon are etched-using photolithography to form a semiconductor strip 151, the gate insulating layer 140, a plurality of projections 154 (FIG. 26), and an amorphous silicon doped with impurities layer 160.

Next, as illustrated in FIGS. 25 to 27, the gate line end portions 129 of the gate line 121 are exposed by etching the gate insulating layer 140 on the gate line end portion 129 of the gate line 121, and a data metal layer (not fully shown) is formed using a sputtering method to deposit a molybdenum-based metal on the gate line end portion 129 of the exposed gate line 121 on the amorphous silicon doped with impurities layer 160. Then, data lines 171 having source electrodes 173 and data line end portions 179, drain electrodes 175, and a corrosion protecting layer 178 are formed using photolithography on the data metal layer.

Next, the amorphous silicon doped with impurities layer 160 which is exposed, e.g., which is not covered with the source electrodes 173 and drain electrodes 175, is removed to form a plurality of source ohmic contacts 163 and a plurality of drain ohmic contacts 165. Further, the projections 154 of the intrinsic semiconductors provided below the layers are exposed.

Figure 28:
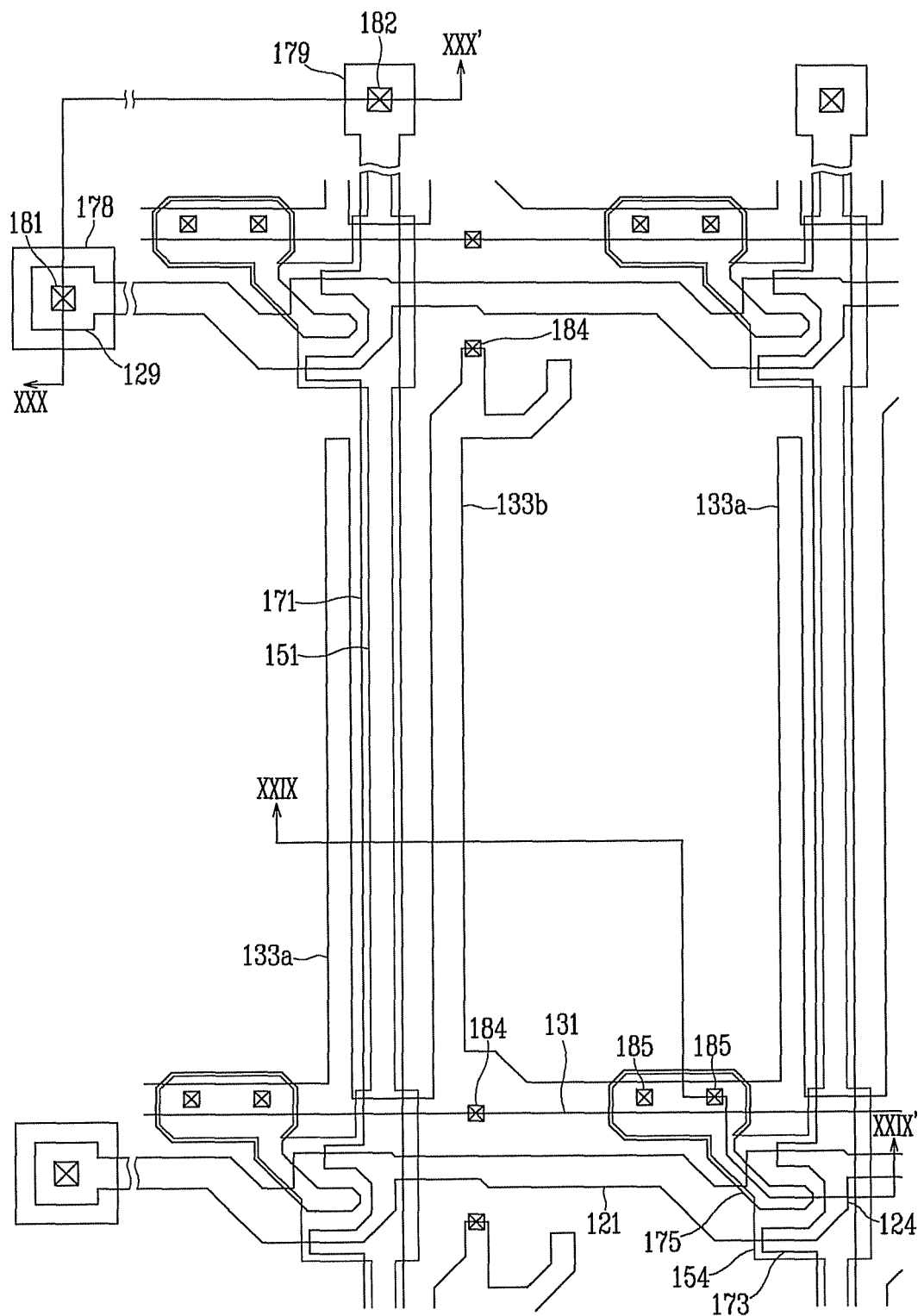
Figure 29:
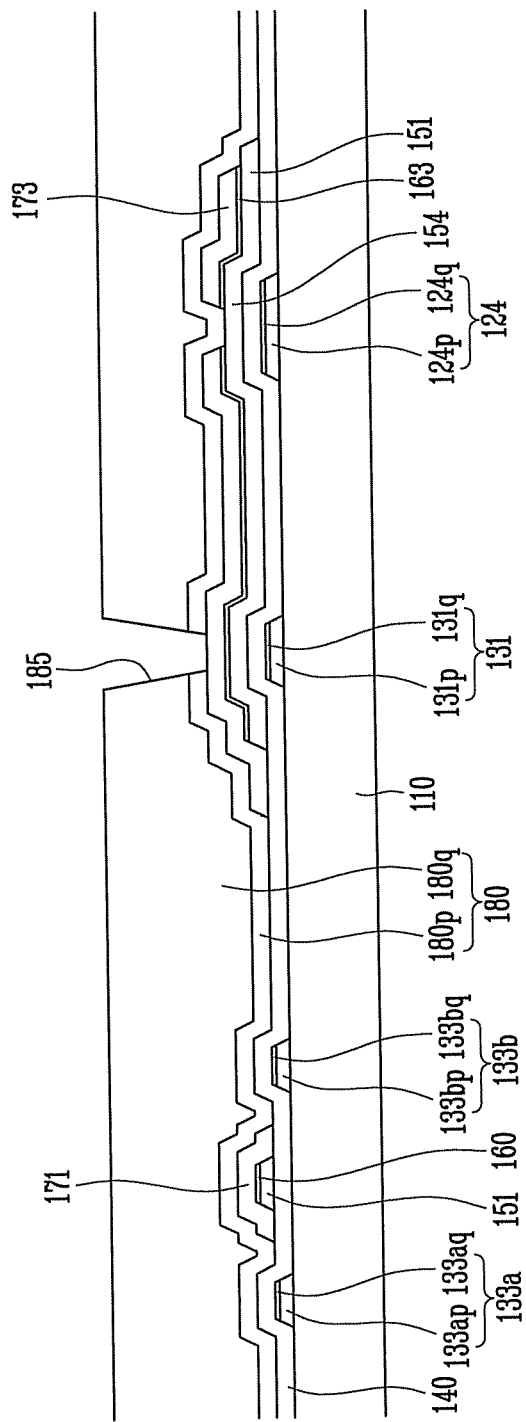
FIGS. 29 and 30 are partial cross-sectional views taken along lines XXIX-XXIX' and XXX-XXX', respectively, illustrating an exemplary embodiment of a manufacturing process of the thin film transistor array panel in FIG. 28.
Figure 30:
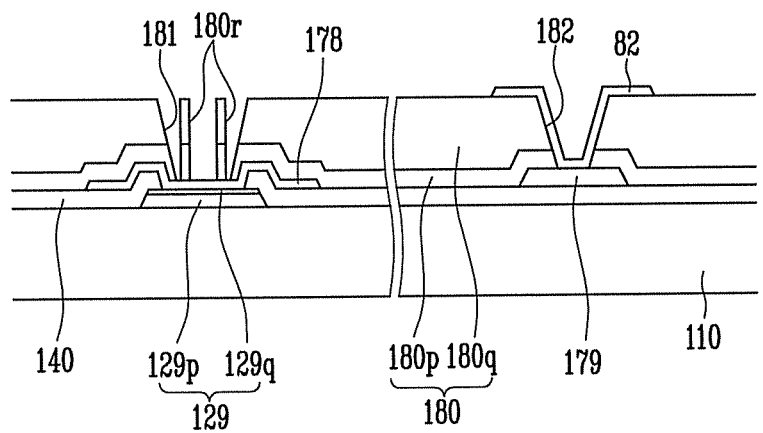
Figure 31:
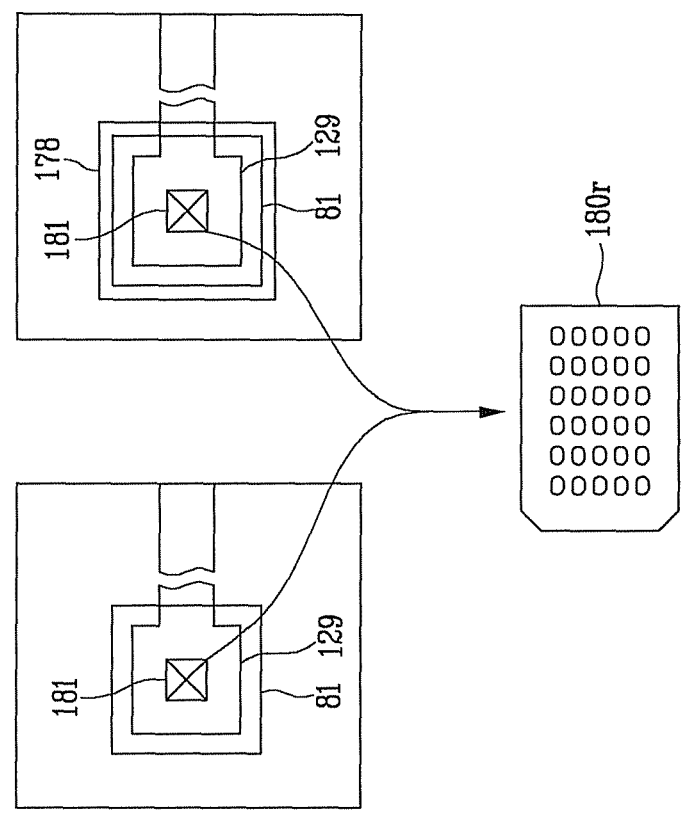
FIG. 31 is an enlarged view of porous connecting portions of a thin film transistor array panel according to an exemplary embodiment of the present invention and a thin film transistor array panel according to another exemplary embodiment of the present invention.
Figure 32:
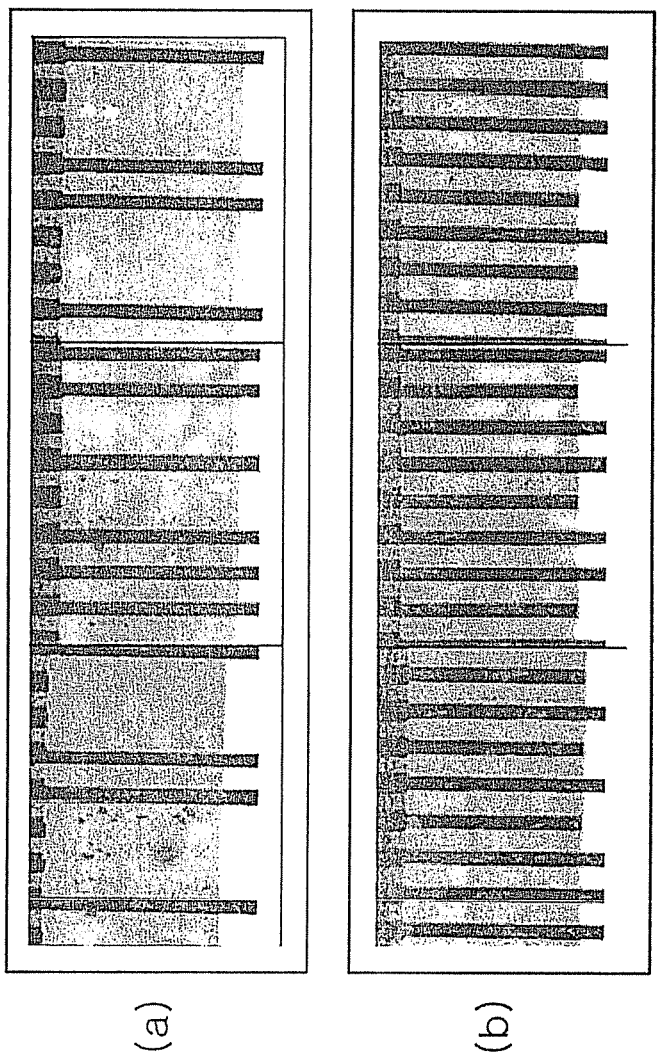
FIG. 32 is a view showing results of salt water tests performed on a porous connecting portion of a thin film transistor array panel according to an exemplary embodiment of the present invention.

Next, as illustrated in FIGS. 28 to 30, a passivation layer 180 is formed to cover the projections 154 of the semiconductor which is not covered with the data line 171 and drain electrode 175. The passivation layer 180 has a dual-layered structure, which includes a lower inorganic layer 180p and an upper organic layer 180q which has excellent insulating characteristics to protect the exposed portions of the semiconductor strip 151. However, the passivation layer 180 may be a single inorganic layer.

Next, the passivation layer 180 is etched using photolithography to form a plurality of gate line end portion contact holes 181, a plurality of data line end portion contact holes 182, a plurality of storage electrode contact holes 184 and a plurality of drain electrode contact holes 185. The gate line end portion contact hole 181 is formed to have the same shape as a porous structure 180r which is formed from a portion of the passivation layer 180 corresponding to the gate line end portion 129 to minimize an exposed area of a corrosion protecting layer 178 when the gate line contact assistants 81 (FIG. 3) and the corrosion protecting layer 178 are connected to each other. However, in an alternate exemplary embodiment of the present invention, the lower inorganic layer 180p may be formed as a single hole structure and only the upper organic layer 180q is formed in the porous structure. In this case, a contact hole of a single hole structure is formed using performing photolithography on the lower inorganic layer 180p before forming the upper organic layer 180q, and then the contact hole of the porous structure is formed using photolithography after forming the upper organic layer 180q above the contact hole of the single hole structure.

Finally, referring back to FIGS. 1 to 3 once more, a transparent conductive material such as ITO is deposited on the passivation layer 180 using a sputtering method, and is patterned to form a pixel electrode 191, gate line contact assistants 81, data line contact assistants 82 and an overpass 84 as discussed in greater detail above in reference to alternative exemplary embodiments.

As illustrated in FIG. 31, in order to minimize an exposed area of the gate line end portion 129 of the gate line 121 (not shown) or an exposed area of the corrosion protecting layer 178, the contact holes 181 for connecting the gate line contact assistants 81 to the corrosion protecting layer 178 and the gate line end portion 129 of the gate line 121 are formed in the porous structure 180r.

The porous structure 180r is diameter of hole ranges 3~6 μm and between two neighboring holes range 6~8 μm.

According to exemplary embodiments of the present invention, when a flexible printed circuit substrate and a TFT array panel are connected to each other at a gate line end portion, a passivation layer having a porous structure is formed at a connection portion at the gate line end portion to connect the flexible printed circuit substrate to the TFT array panel with the porous structure. As a result, an exposed area of the metal of the connection portion is minimized, and it is possible to improve a corrosion resistance of the TFT array panel. Exemplary embodiments of the present invention may further include a corrosion protection layer to enhance or further improve the corrosion resistance.

In addition, when the connection portion between the flexible printed circuit substrate and the TFT array panel is subjected to a force or pressure, e.g., is pressed from above, having a porous structure prevent cracks from forming and/or growing in the area between the flexible printed circuit substrate and the TFT array panel.

While this invention has been described in connection with what is presently considered to be practical exemplary embodiments, it is to be understood that the present invention should not be limited to the disclosed exemplary embodiments herein. Rather, it is intended that various modifications and equivalent arrangements can be made by one of ordinary skill in the art without departing form the spirit and scope of the present invention, as described in the following claims.

What is claimed is:
1. A thin film transistor array panel comprising:
a substrate;
gate lines formed on the substrate, each gate line having an end portion;
a gate insulating layer formed on the gate lines;

a passivation layer formed on the gate lines, the passivation layer having a plurality of first contact holes which expose each of the end portions of the gate lines;

a plurality of contact assistants connected to the end portions of the gate lines through the plurality of first contact holes of the passivation layer, wherein each of the end portions of the gate lines is connected to one of the contact assistants of the plurality of contact assistants through at least two of the first contact holes, wherein the gate insulating layer comprises a plurality of second contact holes and the at least two of the first contact holes exposing a single end portion of the gate lines are located within a single second contact hole of the plurality of second contact holes.

2. The thin film transistor array panel of claim 1, wherein the passivation layer comprises multi layers including an inorganic layer and an organic layer.

3. The thin film transistor array panel of claim 1, wherein the passivation layer comprises a single inorganic layer.

4. The thin film transistor array panel of claim 1, wherein diameter of the first contact hole ranges 3~6 μm and distance between two neighboring first contact holes ranges 6~8 μm.

5. A thin film transistor array panel comprising:

a substrate;

gate lines formed on the substrate, each gate line having an end portion;

a gate insulating layer formed on the gate lines, the gate insulating layer comprising a plurality of first contact holes which expose each of the end portions of the gate lines;

corrosion protecting layers formed on the gate insulating layer and connected to each of the end portions of the gate lines through the plurality of first contact holes;

a passivation layer formed on the corrosion protecting layers and which comprises a plurality of second contact holes which expose the corrosion protecting layers; and a plurality of contact assistants connected to the corrosion protecting layers through the plurality of second contact holes, wherein each of the corrosion protecting layers is connected to one of the contact assistants through at least two of the second contact holes.

6. The thin film transistor array panel of claim 5, wherein the passivation layer further comprises multi layers including an inorganic layer and an organic layer.

7. The thin film transistor array panel of claim 5, wherein the passivation layer comprises a single inorganic layer.

8. The thin film transistor array panel of claim 5, wherein diameter of the second contact hole ranges 3~6 μm and distance between two neighboring first contact holes ranges 6~8 μm.

9. The thin film transistor array panel of claim 5, wherein the corrosion protecting layers comprise a molybdenum-based metal, a copper-based metal, a titanium-based metal, and a chromium-based metal.

* * * * *